US012191295B1

(12) United States Patent
Buckwalter et al.

(10) Patent No.: US 12,191,295 B1
(45) Date of Patent: Jan. 7, 2025

(54) HETEROGENEOUS INTEGRATION OF RADIO FREQUENCY TRANSISTOR CHIPLETS HAVING INTERCONNECTIONS TO HOST WAFER CIRCUITS FOR OPTIMIZING OPERATING CONDITIONS

(71) Applicant: PseudolithIC, Inc., Santa Barbara, CA (US)

(72) Inventors: James F. Buckwalter, Santa Barbara, CA (US); Florian Herrault, Agoura Hills, CA (US); Justin Kim, Santa Barbara, CA (US); Michael Hodge, Huntersville, NC (US); Daniel S. Green, McLean, VA (US)

(73) Assignee: PseudolithIC, Inc., Santa Barbara, CA (US)

( * ) Notice: Subject to any disclaimer, the term of this patent is extended or adjusted under 35 U.S.C. 154(b) by 0 days.

(21) Appl. No.: 18/754,058

(22) Filed: Jun. 25, 2024

(51) Int. Cl.
  *H01L 25/18* (2023.01)
  *H01L 29/737* (2006.01)
  *H01L 29/778* (2006.01)
  *H03K 17/56* (2006.01)

(52) U.S. Cl.
  CPC ............ *H01L 25/18* (2013.01); *H01L 29/737* (2013.01); *H01L 29/7786* (2013.01); *H03K 17/56* (2013.01)

(58) Field of Classification Search
  None
  See application file for complete search history.

(56) References Cited

U.S. PATENT DOCUMENTS 5,192,987 A * 3/1993 Khan .................... H01L 29/205
                                              257/280

\* cited by examiner

*Primary Examiner* — Grant S Withers
(74) *Attorney, Agent, or Firm* — SoCal IP Law Group LLP; Angelo J. Gaz; Steven C. Sereboff

(57) ABSTRACT

An electronic assembly heterogeneously integrates radio-frequency (RF) transistor chiplets into a host wafer, and the chiplets have interconnections to host wafer circuits. The assembly has at least one RF transistor chiplet having a chiplet circuit including a high-electron-mobility transistor (HEMT) or a heterojunction bipolar transistor (HBT). The host wafer has at least one host wafer circuit for the purpose of producing bias conditions that optimize performance of the HEMT or HBT. The host wafer circuit includes first circuitry to provide a DC bias of the HEMT or HBT; or second circuitry configured to sense radio-frequency operating conditions of the HEMT or HBT. The electrical interconnects are between the chiplet and the wafer, and electrically connect the host wafer circuit to the chiplet circuit.

24 Claims, 12 Drawing Sheets

©2024 PseudolithIC, Inc.

©2024 PseudolithIC, Inc.

HETEROGENEOUS INTEGRATION OF RADIO FREQUENCY TRANSISTOR CHIPLETS HAVING INTERCONNECTIONS TO HOST WAFER CIRCUITS FOR OPTIMIZING OPERATING CONDITIONS

NOTICE OF COPYRIGHTS AND TRADE DRESS

A portion of the disclosure of this patent document contains material which is subject to copyright protection. This patent document may show and/or describe matter which is or may become trade dress of the owner. The copyright and trade dress owner has no objection to the facsimile reproduction by anyone of the patent disclosure as it appears in the Patent and Trademark Office patent files or records, but otherwise reserves all copyright and trade dress rights whatsoever.

BACKGROUND

Field

This disclosure relates to heterogeneous integration of radio frequency (RF) transistor chips (or chiplets) having interconnections to host wafer circuits (or circuitry) that optimize or produce desired operating conditions of the RF transistors. The chiplets may be laterally bonded to the sidewalls of cavities of the wafer, such as using a lateral bonding material and where the wafer and chiplets are fabricated separately as a disaggregated integrated circuit.

Description of the Related Art

Electronic assemblies, or hybrid circuits, comprise microelectronic circuits fabricated separately and assembled together so as to form a single component, which can itself be encapsulated in an electronic circuit package. Assembling microelectronic circuits fabricated separately allows, for example, testing of all the microelectronic circuits separately, prior to assembling them, which, in turn enables improved fabrication yields of the final component. This capability is particularly significant if some of the microelectronic circuits fabricated separately are difficult and/or expensive to manufacture. Assembling microelectronic circuits fabricated separately also allows combining of microelectronic circuits, which themselves employ different materials and different manufacturing processes, into a single final component. This capability can lead to higher circuit performance.

There exists a need for an electronic assembly using a host wafer having pre-fabricated interconnects and integrated circuitry, such as passive and active components, that connect to a wafer level microelectronics active chiplet (i.e., with radio frequency transistors) integrated in through-wafer cavities of the host wafer. This need may for example be for an assembly for microwave or other radio frequency (RF) integrated circuits that decouple the fabrication of the chiplet active circuits (e.g., fabrication of the RF transistors) of the chiplets from the fabrication of the passive circuits and transistors (e.g., fabrication of the CMOS transistors, interconnects, resistors and capacitors) of the wafer. Satisfying this need will allow for much faster manufacturing of the circuits, at lower cost, and a scaling up of active device technologies to circuits without cost and cycle time burdens.

Figure 2:
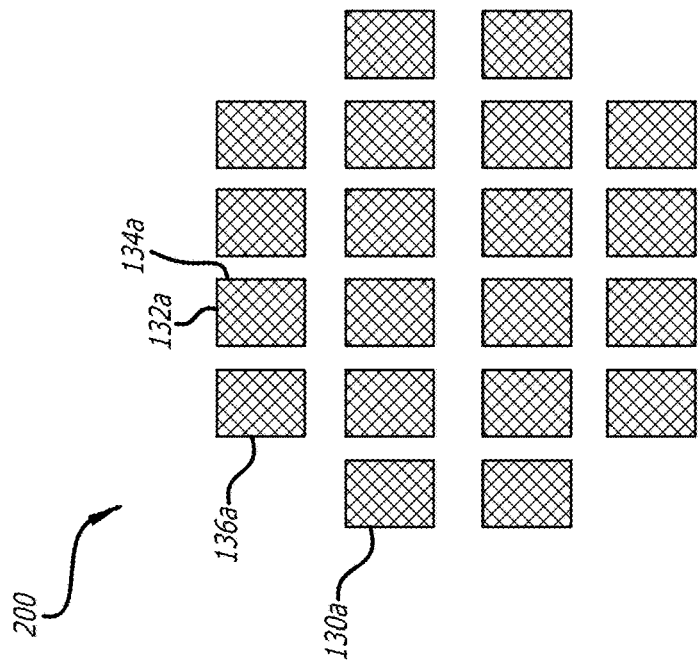
FIG. 2 is a schematic top view of a first set of multi-thickness chiplets for in-substrate chiplet integration into wafer cavities of a host wafer using lateral dielectric material.

Throughout this description, elements appearing in figures are assigned three-digit or four-digit reference designators, where the two least significant digits are specific to the element and the one or two most significant digit may be the figure number where the element is first introduced or fabricated. An element that is not described in conjunction with a figure may be presumed to have the same characteristics and function as a previously-described or subsequently-described element having the same reference designator.

DETAILED DESCRIPTION

Description of Apparatus

The following describes improved wafers, die, chips and fabrication techniques thereof for electronic assemblies having in-substrate chips (e.g., chiplets) integrated into wafer cavities of a host wafer, such as using lateral bonding material that may be a dielectric. The host wafer can have pre-fabricated interconnects and integrated circuitry, such as passive and active components, that connect to chiplet level microelectronics transistor chiplets integrated in through-wafer cavities of the wafer. This may form an assembly for integrated circuit devices or diced chip where the chiplets contain active circuits from at least one semiconductor technology (often a more expensive and refined RF semiconductor technology) and the wafer contains passive and active circuits from another semiconductor technology (often a cheaper and larger scale technology, such as including CMOS on a silicon wafer). Using a low-cost large-diameter wafer integration platform or interposer for the higher cost chiplets with active devices allows for much faster manufacturing of the assembled circuits, at larger scale and lower cost.

The electronic assembled circuit may integrate chiplets having one type of components into a carrier wafer having a different type of components. The electronic assembled circuit may integrate chiplets having high-performance integrated circuits, such as Gallium Nitride (GaN) radio frequency (RF) integrated circuits (ICs) into host wafers having other integrated circuits, such as silicon-based integrated circuits, in a manner that is inexpensive and has high manufacturing yields and short manufacturing cycles. The high performance RF ICs, chips (or chiplets) can have type III-V transistors or other types of transistors and passives, and can be integrated together with host wafer CMOS devices, resistors, inductors, capacitors and matching networks, from another semiconductor technology. For example, the RF ICs can be one type of semiconductor technology that is integrated together with CMOS transistors, resistors, inductors, capacitors and matching networks from another semiconductor technology that are part of the host wafer. A chiplet may be a chip including the circuitry, material, and/or devices noted herein for a chiplet. It may also be a chip or small chip having active microelectronic (i.e., transistor) devices, CMOS devices, microwave IC devices and/or radio frequency (RF) IC devices. It may also be a chip or small chip having a SAW, BAW or other acoustic wave device. A chiplet is defined by a surface area, such as smaller than 500 um on a side.

Figure 1:
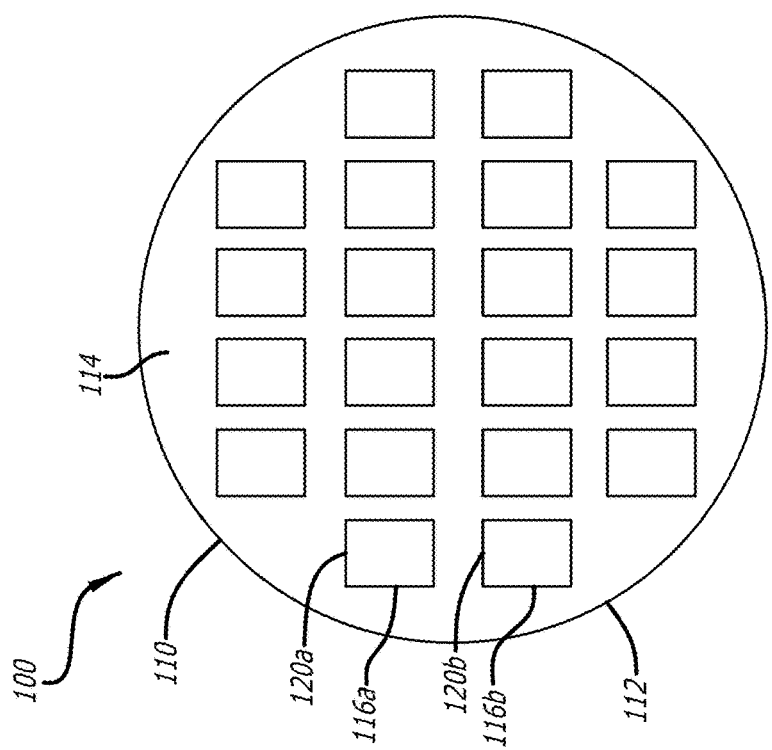
FIG. 1 is a schematic top view of a host wafer having cavities for in-substrate multi-thickness chiplet integration into the wafer cavities of the host wafer using lateral dielectric material.
Figure 5:
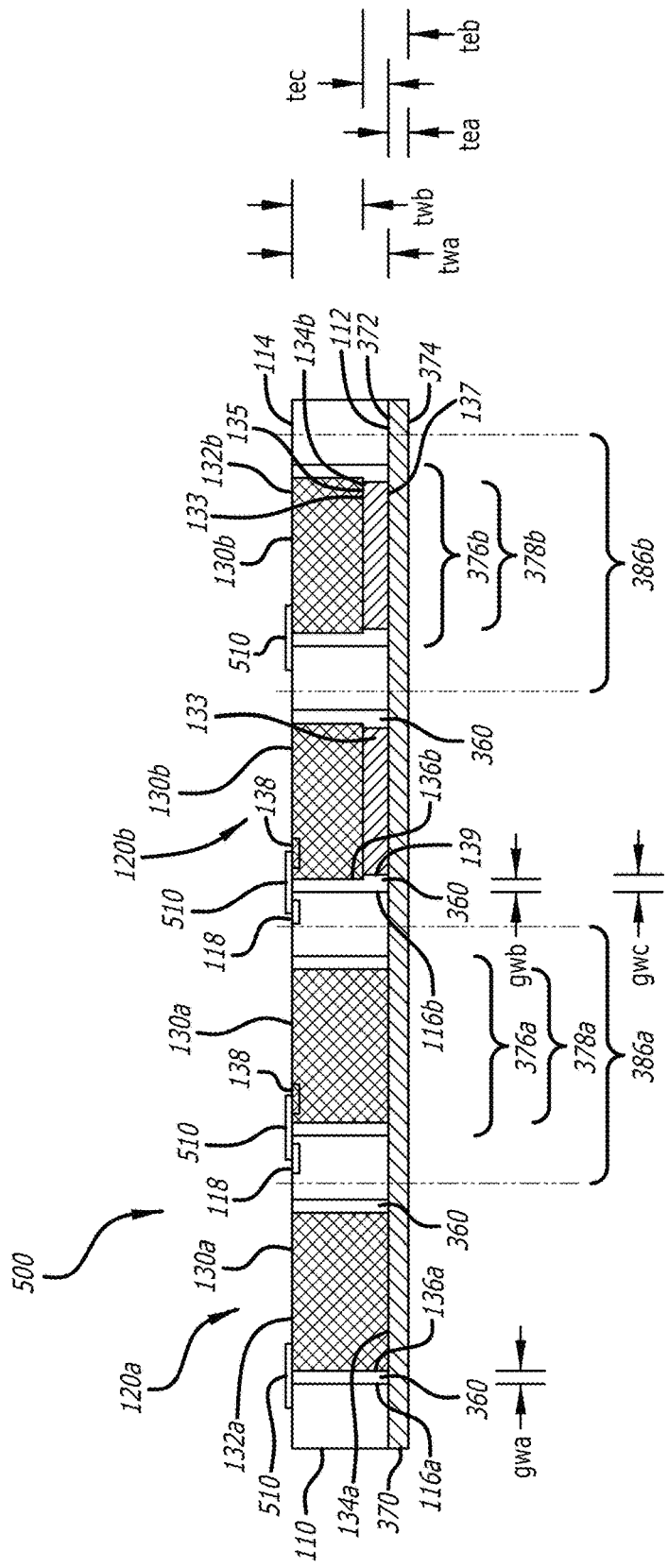
FIG. 5 is a schematic cross-sectional view of a device having in-substrate multi-thickness chiplet integration into wafer cavities of a host wafer using lateral dielectric material.

FIG. 1 is a schematic top view 100 of a host wafer 110 having cavities 120a and 120b for in-substrate multi-thickness chiplet integration into the wafer cavities 120a and 120b of a host wafer 110, such as using lateral bonding material. Host wafer 110 has back surface 112 and front surface 114 as shown in FIG. 5. Host wafer 110 and each cavity 120a and 120b has side surfaces 116a and 116b respectively. Each of side surfaces 116a and 116b may be a vertical or sidewall surface between the back surface 112 and front surface 114. There may be 3, 4 or more side surface 116a and 116b in each of the cavities. Typically, there are 4 side surfaces in each of the cavities. Each cavity 120a and 120b may have a minimum of one sides (e.g., may be a circle) and up to an infinite number of sides, but preferably has 4 sides.

Wafer 110 may be or include (e.g., as a mixture of materials or as material layers) silicon, silicon germanium, silicon on insulator, gallium arsenide, indium phosphide, aluminum nitride, diamond, silicon carbide, quartz, alumina. If the wafer only contains interconnections and passive components, it can be a dielectric such as glass, quartz, alumina, or another ceramic. The host wafer 110 may be a Si CMOS wafer. The host wafer 110 may have layers of one or more of these materials in the form of an oxide material, crystalline material and polycrystalline material and/or amorphous material. Wafer 110 may include at least one of resistors, capacitors, inductors, through substrate vias, dielectric layers, metal layers (e.g., signal traces or signal planes). Wafer 110 may include at least one layer of silicon, silicon carbide (SiC), quartz, or another semiconductor wafer material.

Wafer 110 may include areas to be diced into integrated circuits, each having passive integrated components (e.g., signal traces, interconnects and conductive vias, resistors, inductors and/or capacitors), and at least two multi-thickness chiplets that each have a single transistor and/or a plurality of transistors. Silicon is an advantageous choice for wafer 110, because it takes advantage of having a lower expense than other materials; and/or of known microelectronics fabrication processes and of scaling and manufacturing capabilities.

FIG. 2 is a schematic top view 200 of a first set of multi-thickness chiplets 130a for in-substrate multi-thickness chiplet integration into wafer cavities 120a of a host wafer 110, such as using lateral bonding material. Chiplets 130a have frontside 132a (e.g., a frontside surface), a backside 134a (e.g., a backside surface), and a thickness twa as shown in FIG. 5. Each chiplet 130a has side surfaces 136a, such as a vertical or sidewall surfaces between the frontside surface 132a and backside 134a. The chiplets 130a could have anywhere between 0 (e.g., have a curved perimeter, be a circle, be an oval, etc.) and tens of sides 136a. There may be 3, 4 or more side surface 136a. There may be 4 sides. The number of side surfaces 136a of each chiplet 130a may be the same as the number of surfaces 116a.

Figure 3:
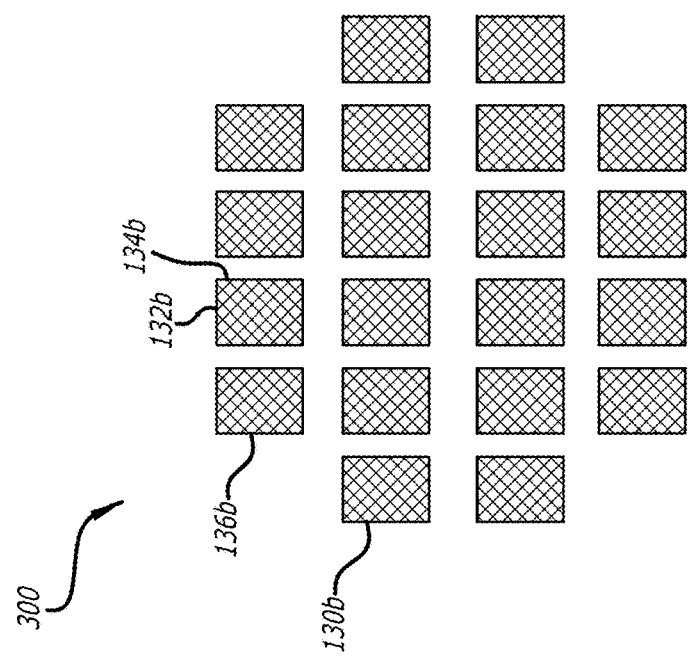
FIG. 3 is a schematic top view of a second set of multi-thickness chiplets for in-substrate chiplet integration into wafer cavities of a host wafer using lateral dielectric material.

FIG. 3 is a schematic top view 300 of a second set of multi-thickness chiplets 130b for in-substrate multi-thickness chiplet integration into wafer cavities 120b of a host wafer 110, such as using lateral bonding material. Chiplets 130b have frontside 132b, a backside 134b, and a thickness twb as shown in FIG. 5. Each chiplet 130b has side surfaces 136b, such as a vertical or sidewall surfaces between the frontside surface 132b and backside 134b. The chiplets 130b could have anywhere between 0 and an infinite number of sides 136b. There may be 3, 4 or more side surface 136b. The number of side surfaces 136b of each chiplet 130b may be the same as the number of surfaces 116b.

Chiplets 130a and 130b may each be or include (e.g., as a mixture of materials or as material layers) silicon, silicon germanium, silicon-on-insulator, gallium arsenide, indium phosphide, aluminum nitride, quartz, alumina, gallium nitride, silicon carbide. The chiplets 130a and 130b may each have layers of one or more of these materials in the form of an oxide material, crystalline material and polycrystalline material and/or amorphous material. There may be different electrical component ones or types of each of chiplets 130a and 130b that are manufactured separately from each other. That is, each of chiplets 130a may be manufactured separately from each other, and each of chiplets 130b may be manufactured separately from each other. Also, chiplets 130a may be manufactured separately from chiplets 130b. Each of chiplets 130a and 130b can include a GaN, InP or GaAs or any other industry-known electrical component and can be fabricated on a substrate such as Si, SiGe, InP, GaAs, SiC, Alumina, or diamond, or any other substrate known in the industry.

Chiplets 130a and 130b or types of chiplets 130a and 130b may include RF switches, transmit and/or receive circuits; power switches, amplifiers and circuits such as using GaAs, InP, GaN; and/or transistors such as Si CMOS transistors. They may have smaller and more expensive electrical components than those of wafer 110. There may be hundreds, thousands or tens of thousands of chiplets 130a and 130b embedded in one wafer 110. Wafer 110 may have more passive components, lower cost components, routing (e.g., traces, conductive vias and interconnections) than those of chiplets 130a and 130b. Wafer 110 may be fabricated using different microelectronic fabrication techniques or processes than used to fabricate chiplets 130a and 130b.

Chiplets 130a and 130b can be made of different materials than wafer 110. For example, wafer 110 can be a silicon wafer while chiplets 130a and 130b can be a type III-Nitride material component chip. Chiplets 130a and 130b may each be or include an integrated circuit having passive integrated components (e.g., signal traces, interconnects and conductive vias, resistors, inductors and/or capacitors), a single transistor and/or a plurality of transistors.

The chiplets 130a and 130b, may each include at least one of transistor circuitry and interconnects to contact pads on a frontsides 132a and 132b of the chiplets 130a and 130b. The chiplets 130a and 130b may be high-end pre-fabricated active device chiplets that are integrated into wafer 110 through pick and place assembly, such as into cavities 120a and 120b, on a temporary wafer with an adhesive laminate or simply on an adhesive laminate.

The chiplets 130a and 130b, may each be compound semiconductor wafers that are used as transistor building blocks into heterogeneously-integrated silicon circuits including wafer 110. The chiplets 130a and 130b may be from wafers processed at foundries using qualified processes, and later diced into the chiplets prior to the heterogenous integration. Based on the chiplets technology (e.g., InP, GaAs, GaN, . . . ) and based on the foundry utilized, the final chiplet thicknesses may range from 50 microns (2-mil-thick) to up to 150 microns (6-mil-thick). In some cases, one or more of chiplets 130b is 2× thinner than one or more of chiplets 130a.

Figure 4:
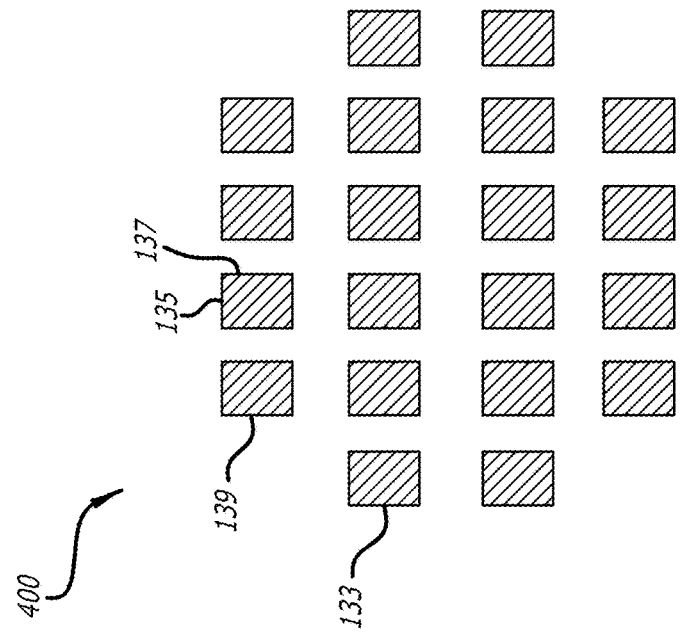
FIG. 4 is a schematic top view of metal backfill plugs for in-substrate multi-thickness chiplet integration into wafer cavities of a host wafer using lateral dielectric material.

FIG. 4 is a schematic top view 400 of metal backfill plugs 133 for in-substrate multi-thickness chiplet integration into wafer cavities 120b of a host wafer 110, such as using lateral bonding material. Plugs 133 have frontside 135, a backside 137, and a thickness tec as shown in FIG. 5. Each plug 133 has side surfaces 139, such as a vertical or sidewall surfaces between the frontside surface 135 and backside 137. The plugs 133 could have anywhere between 0 and an infinite number of sides 139. There may be 3, 4 or more side surface 139. The number of side surfaces 139 of each plug 133 may be the same as the number of surfaces 116b or 136b. In some cases, plugs 133 are "backside metal fills" to thicken the chiplets 130b. This enables good thermal conductivity for all the embedded chiplets 130b, no matter their original thickness.

FIG. 5 is a schematic cross-sectional view of a device 500 having in-substrate chiplets 130a and 130b integrated into wafer cavities 120a and 120b of a host wafer 110 using lateral bonding material 360. Device 500 may include the devices of FIGS. 1-4. As shown, thickness twb chiplets 130b is less than thickness twa of chiplets 130a; and a metal backfill plug 133 is formed on backside 134b of chiplets 130b.

Chiplets 130a, such as a number of chips, have a backside 134a and a frontside 132a, with the backsides 134a of the chiplets 130a bonded directly to at least portion 378a of the plurality of areas 376a of the top surface 372 of the backside capping layer 370. Portion 378a may be the footprint of the chiplet 130a on top surface 372 within the cavity 120a. A gap gwa between side surfaces 116a and 136a may be the difference between area 376a and portion 378a. The backside 134a may be directly attached to and touching the top surface 372. The bond between the backside 134a and the top surface 372 may be a covalent, chemical or atomic bond. Areas 376a and portions 378a have a thickness "tea" of the backside capping layer 370.

The cavities 120a may be through-substrate holes or through substrate holes etched in the wafer at the areas 376a. The chiplets 130a may be embedded into the wafer 110 at the substrate holes or at cavities 120a.

A lateral bonding material 360 extends between side surfaces 136a of the chiplets 130a and the side surfaces 116a of the wafer or cavities. The lateral bonding material 360 may mechano-chemically bond the side surfaces 136a of the chiplets 130a to the side surfaces 116a of the wafer. The lateral bonding material 360 may form a mechanical and/or a chemical bond to the side surfaces 136a and to the side surfaces 116a. The bonding may be a mechano-chemical bond. In some cases, the lateral bonding material 360 is a molded material that is molded between chiplets 130b and wafer 110 within cavities 120b. In some cases, the dielectric material 360 has a coefficient of thermal expansion between or equal to one of those of the wafer 110, and of the chiplets 130a and/or 360b.

Chiplets 130b, such as a number of chips, have a backside 134b and a frontside 132b, with the backsides 134b of the chiplets 130b bonded to at least portion 378b of the plurality of areas 376b of the top surface 372 of the backside capping layer 370.

Backsides 134b of chiplets 130b may be directly bonded to metal backfill plugs 133 which are in turn boded directly to portions 378b of the backside capping layer 370. Plugs 133, such as a plurality of metal backfill material, have a backside 137 and a frontside 135, with the frontside 135 bonded to backside 134b of chiplet 130b and the backsides 137 bonded to at least portion 378b of the backside capping layer 370. Backsides 134b may be bonded to a surface of metal backfill plugs 133 that is the same size as portions 378b. Plugs 133 may have a perimeter that is the same as that of portions 378b. Plugs 133 may have a perimeter that is less than that of chiplet 130b as shown. In other cases, the two perimeters are the same. In other case, plugs 133 may have a perimeter that is greater than that of chiplet 130b.

Portion 378a may be the footprint of the chiplet 130a or plug 133 on top surface 372 within the cavity 120b. A gap gwb is between side surfaces 116b and 136b. A gap gwc is between side surfaces 139 of plug 133 and 136b. Gap gwc may be the difference between area 376b and portion 378b. As shown, gap gwc is greater than gap gwb. In other cases, these gaps may be the same. In other case, gap gwc is less than gap gwb.

The backside 134b may be directly attached to and touching the frontside 135 and backside 137 may be directly attached to and touching the top surface 372. The bonds between the backside 134b and the frontside 135 and between backside 137 and the top surface 372 may be a covalent, chemical or atomic bond. Portions 378b have a thickness "teb" that is thickness "tea" the backside capping layer 370 plus a thickness "tec" of plug 133. It can be said that thickness "teb" is a thickness of the backside capping layer 370 due to plug 133 being a metal backfill plug. Thickness "teb" may be a thickness of the backside capping layer 370 due to plug 133 being of the same material as layer 370.

The metal backfill plug 133 may be from a copper metal deposition layer; an electroplated metal layer; and/or a sputtered metal seed layer (e.g., titanium Ti and/or copper Cu) plated with a plate metal such as copper on the formed or deposited on backsides 134b of the chiplets 130b. The seed layer may be a Ti/Cu 200/2,000 angstrom (A) wafer-level backside sputtering on the backside 134b of the chips 103b, Plugs 133 may be backside metal backfill adjusted in width, length and thickness ranging from 0.1 um to 1,000 microns thick using an electroplating process. Plugs 133 may be between 5 and 60 microns thick, and chiplets 130b may be between 200×200 um thick.

In some cases, plugs 133 are formed of a metal such as copper, gold, silver, titanium, tungsten, or the like. They may be formed of a material that includes or is a combination of the metals above. They may be formed of an alloy or ceramic. Plugs 133 may have a footprint that is between 20 microns and 20 microns by between 5,000 microns W and 5,000 microns; or that has an area ranging from 0.04 $mm^2$ and 25 $mm^2$. Chiplets 130a and 130b may have a footprint that is between 100 microns and 100 microns by between 5,000 microns and 5,000 microns; or that has an area of 0.1 to 25 $mm^2$.

Layer 370 may be formed of a metal such as copper, gold, silver, titanium, tungsten, and the like. It may be formed of a material that includes or is a combination of the metals above. It may be formed of an alloy or ceramic. Layer 370 and plugs 133 may be the same material. They may be different materials.

As shown thickness twa of chiplets 130a is greater than thickness twb of chiplets 130b, and thickness "tea" of the metalization under of chiplets 130a is less than thickness "teb" of the metalization under of chiplets 130b. The thickness teb of the backside capping layer 370 or of the metalization under of chiplets 130b may be described as including metal backfill plugs 133 between the backsides 134b of the chiplets 130b and the thickness "tea" of the backside capping layer 370.

A lateral bonding material 360 extends between side surfaces 136b of the chiplets 130b and the side surfaces 116b of the wafer or cavities. The lateral bonding material 360 may mechano-chemically bond the side surfaces 136b of the chiplets 130b to the side surfaces 116b of the wafer. The lateral bonding material 360 may form a mechanical and/or a chemical bond to the side surfaces 136b and to the side surfaces 116b. The bonding may be a mechano-chemical bond. In some cases, the lateral bonding material 360 is a molded material that is molded between chiplets 130b and wafer 110 within cavities 120b.

The lateral bonding material 360 extends between side surfaces 139 of the plugs 133 and the side surfaces 116b of the wafer or cavities. The lateral bonding material 360 may mechano-chemically bond the side surfaces 139 of the plugs 133 to the side surfaces 116b of the wafer. The lateral bonding material 360 may form a mechanical and/or a chemical bond to the side surfaces 139 and to the side surfaces 116b. The bonding may be a mechano-chemical bond. In some cases, the lateral bonding material 360 is a molded material that is molded between plugs 133 and wafer 110 within cavities 120b.

Each of the chiplets 130a and 130b may have between 3 and 6 sides. They may have 4 sides. The sides may be straight, curved or wavy in profile as viewed from a top perspective. The cavities 120a and 120b may have the same number of and sides corresponding to the shapes of the sides of the chiplets 130a and 130b, respectively. In some cases, chiplets 130a are formed by a different foundry process than the chiplet 130b.

Interconnects 510 may be formed directly on the lateral bonding material 360 and connect electrical (e.g., power, ground and/or signal) contacts 138 of the chiplets 130a and 130b to contacts 118 of the wafer 110. Interconnects 510 may include direct interconnect routing or traces that is formed directly on the lateral bonding material (e.g., without any dielectric/air gap), and that extends from the chiplets to wafer electrical routing. Interconnects 510 may be bonded to material 360, directly attached to material 360, touching material 360 and/or have no air gap between the interconnect and the material 360. The interconnect routing may include low loss high-performance DC, RF, and mm-wave routing from the chiplets 130a and 130b, directly on the lateral bonding material, and to wafer electrical routing. Interconnects 510 may be directly on material 360 by being bonded to and/or directly attached to (e.g., touching) the top surface of the lateral bonding material 360.

Each chiplet 130a and 130b may include at least one of active device circuitry and interconnects 510 to contact pads 138 on a front surface of the chiplet 130a and 130b. Each chiplet 130a and 130b may be a pre-fabricated transistor chiplet. FIG. 5 may show how the interconnect structure 510 directly sits on top of the dielectric bonding material 360 between the chiplets 130a or 130b, and wafer 110.

Each of chiplets 130a and 130b may include one or more transistors having its terminals connected to at least one integrated circuit contact 138 (e.g., contact pad), such as by a conductive via (not shown). Each of chiplets 130a and 130b can comprise a substrate and integrated circuit layers formed on top of its substrate, the thickness of the integrated circuit layers being for example only a fraction of the thickness of the substrate (for example between $1/10$ and $1/1000$ of the thickness of the substrate). In some cases, the total thickness of each of chiplets 130a and 130b is smaller than the total thickness of host wafer 110. In some cases, lateral bonding material 360 contacts the side surfaces 136a of chiplet 130a along most of their height (at least 50% of the height, starting from close to the top surface of chiplet 130a). Preferably, lateral bonding material 360 contacts essentially all of the side surfaces 136a, 136b and 139. Preferably, lateral bonding material 360 fills gaps gwa, gwb and gwc, completely up to a level essentially flush with the front surface 114 of host wafer 110.

It is considered that the host wafer 110 can be vertically diced at dicing lines (shown by the vertical bars in FIG. 5) along a perimeters 386a and/or 386b of the wafer around at least one chiplet to form a chip having the at least one chiplet and an area of the wafer surrounding the at least one chiplet. In some cases, wafer 110 is vertically diced at dicing lines along perimeters 386a and 386b around at least one of each of chiplets 130a and 130b to form at least two chips each having the at least one chiplets 130a or 130b and an area of the wafer surrounding the at least two chiplets. Wafer 110 may be vertically diced along perimeters 386a and 386b around numerous or all of chiplets 130a and 130b to form chips each having the at least one of chiplets 130a or 130b and an area of the wafer surrounding the chiplets. Wafer 110 may be vertically diced along perimeters around two or more of chiplets 130a or 130b to form chips and an area of the wafer surrounding the chiplets. Wafer 110 may be vertically diced along perimeters around two or more of chiplets 130a and 130b to form chips and an area of the wafer surrounding the chiplets.

The diced chips having the chiplet(s) may each be a structure where the chiplets are embedded within the volume of a silicon/CMOS wafer 110 using a dielectric sidewall bonding technique to form material 360. The diced chips may be structures where chiplets of different thicknesses can be co-integrated into the same silicon wafer 110 using the same dielectric sidewall bonding technique of material 360, while maintaining high-thermal-conductivity on the backside of all the chiplets.

In some cases, descriptions for FIGS. 1-5 can be used to describe a single thickness chiplet such as only either chiplet 130a or 130b integrated into wafer 110. This description may be either FIGS. 1 and 2, and the left two chiplets 130a of FIG. 5; or FIGS. 1 and 3-4, and the right two chiplets 130b of FIG. 5.

FIGS. 6-13 disclose microwave, analog and digital circuitry that is integrated into a co-located or co-planar substrate (e.g., wafer 110) with a collection of compound semiconductor transistors (e.g., of the chiplets and wafer) to optimize the operation of (e.g., tune the operating bias conditions of) each transistor. Optimizing operating conditions may be or include producing desired operating conditions of or for the RF transistors; producing bias conditions that optimize performance of the RF transistors; and/or optimizing RF characteristics of the RF transistors.

This technology may rely on designing and sourcing compound semiconductor wafer chiplets that are used primarily as transistor building blocks in a heterogeneously-integrated silicon wafer 110. The wafers that produce the chiplets may be processed in separate foundries using qualified processes, and later diced into the chiplets prior to heterogenous integration into the wafer. Based on the chiplet technology (e.g., Indium Phosphide, Gallium Arsenide, Gallium Nitride), the final wafer 110 thicknesses may range from 50 microns (2-mil-thick) to up to 150 microns (6-mil-thick). In some cases, one or more different semiconductor chiplets (e.g., chiplets 130a and 130b) are embedded within the volume of a silicon/CMOS wafer 110 using a dielectric sidewall bonding 360 technique. In some cases, the compound semiconductor transistor is embedded as a chiplet into a substrate containing silicon complementary-metal-oxide semiconductors (CMOS) that can be used to realize microwave, analog, and digital circuitry. In some cases, matching to compound semiconductor transistors is performed using a silicon substrate having interconnection tuning circuits. In some cases, CMOS transistors embedded in a silicon substrate are used to verify the fabrication and yield of the chiplet such as by forming built in self-tests for heterogeneous integrated radio frequency chiplets.

Thus, while it is possible to integrate multiple compound semiconductor chiplet transistors into the same wafer of another semiconductor material as noted, the use of the multiple technologies demands an ability to optimize and/or tune (e.g., sense and adapt) the operating conditions or biasing of each chiplet transistor in situ. This may result in heterogeneous integration of radio frequency (RF) transistor chips (or chiplets) having interconnections to host wafer circuits, such as CMOS, that optimize (e.g., tune) operating conditions of the RF transistors.

For example, FIG. 5 may show a cross section of device 500 having wafer 110 with embedded compound semiconductor chiplets 130a and 130b having RF chiplet transistors (e.g., that are compound semiconductors) and wafer 110 having CMOS transistors optimize operating conditions of the RF transistors. Here, thicker chiplets 130a may each include one or more heterojunction bipolar transistors (HBTs), and thinner chiplets 130b may each include one or more high-electron-mobility transistors (HEMTs) while the wafer has active CMOS transistors to sense and adapt the operating conditions or biasing of each chiplet transistor in situ. In some cases, wafers or chiplets with separate HEMT and HBT devices will require separate biasing circuits and/or voltages. In some cases, HEMT and HBT devices will require separate biasing circuits and/or voltages.

In some cases, FIG. 5 may show a cross-sectional rendering of a silicon (CMOS) host wafer 110 with through-substrate cavities 120a and 120b filled with chiplets 130a each having at least on HBT and 130b each having at least on HEMT each sourced from a different compound semiconductor foundry and formed of or on a different semiconductor material or wafer which are both or separately integrated into the host wafer 110 using sidewall bonding material 360. One or more of the chiplets may be diced with part of wafer 110 including CMOS technology as noted herein. In this cross-section of FIG. 5, one feature shown is the integration of different chiplets 130a and 130b of different thicknesses into the same host wafer 110. As an example, chiplets 130b might be the same thickness or 2× thinner than chiplets 130a. The die 110 having chiplets 130a and 130b may represent different compound semiconductor devices or different types of semiconductor devices.

Figure 6:
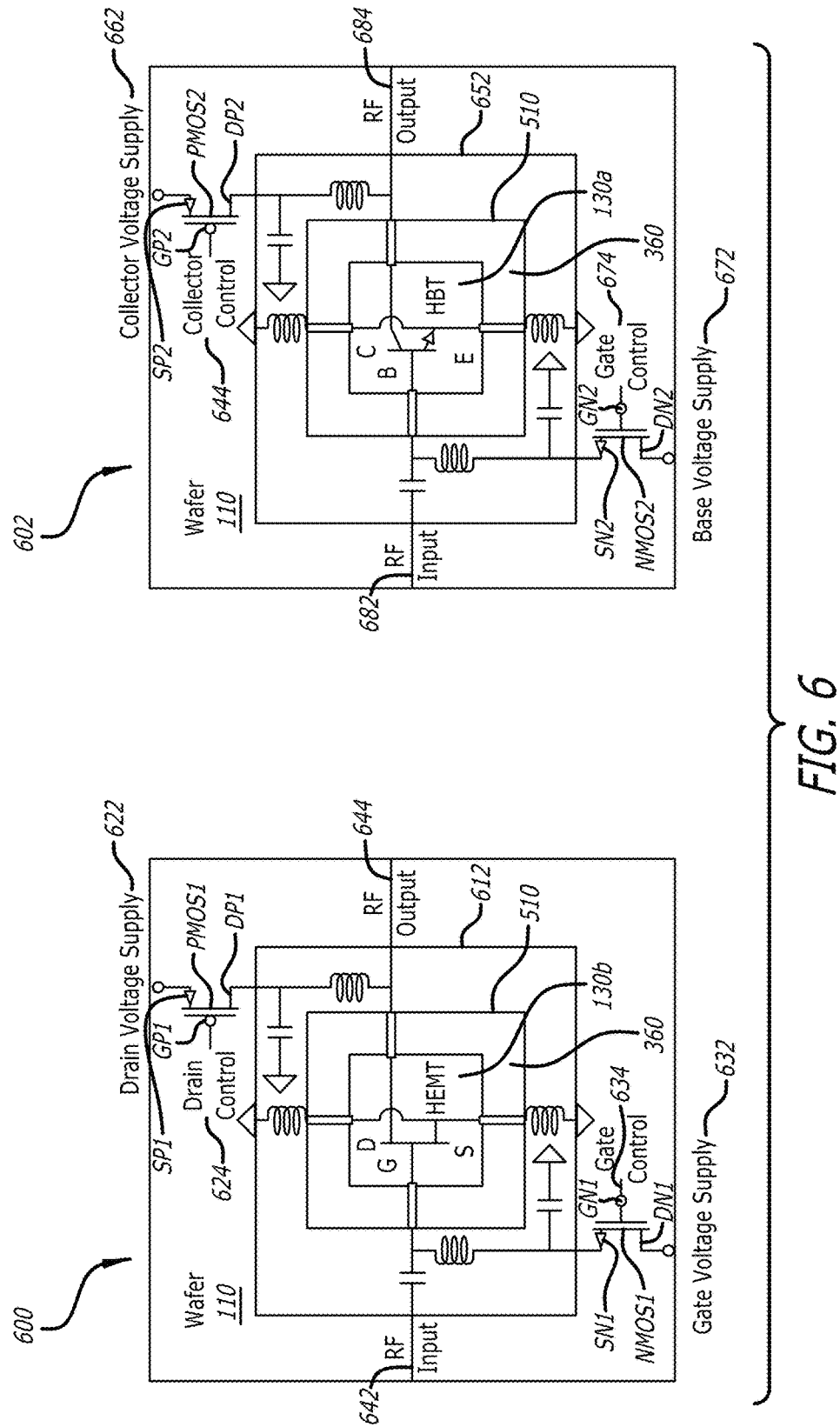
FIG. 6 shows a top view of a breakdown of two circuits each including a CMOS-based wafer, and a HEMT or an HBT of a chiplet that is heterogeneous integrated into the wafer.

FIG. 6 shows a top view of a circuit diagram breakdown of circuits 600 and 602 each including a CMOS-based wafer 110 (e.g., a silicon interposer), and a HEMT of chiplet 130b on the left at circuit 600 or a HBT of chiplet 130a on the right at circuit 602. Note that the location of the chiplets 130b and 130a in FIG. 6 is left to right reversed compared to that of the embodiment of FIG. 5. The HEMT or HBT may represent any appropriate chiplet transistor of FIGS. 1-5.

HEMTs may be high-electron-mobility transistors (HEMTs) or metal-insulator-semiconductor high-electron mobility transistors (MISHEMTs) that are field-effect transistors (FETs) utilizing a heterojunction of materials with different band gaps. They offer enhanced performance in high-frequency applications. A heterojunction is the region of interface between two dissimilar semiconductors which helps to lower the band gap and prevent recombination of charge carriers due to the presence of multiple valence and conduction bands. In a simple definition, a homojunction is a junction between the same materials with the same crystalline structure. A heterojunction is a junction between different materials or between the same materials, but with different crystal structure. An HBT may be a type of bipolar junction transistor (BJT) which uses differing semiconductor materials for the emitter and base regions, creating a heterojunction. The HBT improves on the BJT in that it can handle signals of very high frequencies, up to several hundred GHz. The HBT may have a base-emitter junction that is forward biased and a collector-base junction that is reversed biased. The equilibrium is distributed and electrons are injected from the emitter into the base. The HEMT is shown with gate G, source S and drain D. The HBT is shown with base B, collector C and emitter E.

Circuit 600 shows compound semiconductor chiplet 130b bonded to chiplet 110 by lateral bonding material 360. Circuit 600 shows interconnects 510 over or on material 360 connecting the HEMT (e.g., circuitry of chiplet 130b) to circuitry of the wafer 110.

Circuit 600 shows wafer 110 having matching network 612, such as passive capacitors, inductors, resistors and connections to ground, connected through heterogeneous interconnects 510 to the HEMT (e.g., circuitry of chiplet 130*b*). Network 612 may include one or more matching networks or tuning circuits such as passive tuning circuits that reduce electrical mistuning of the transistors caused by the electrical interconnects that degrades transistor performance and increase uncertainty of the chiplet circuit operation.

Wafer 110 of circuit 600 is shown having RF input signal line 642 and RF output signal line 644 connected (e.g., through network 612 and) through interconnects 510 to the gate G and drain D of the HEMT, respectively. Wafer 110 of circuit 600 is shown having CMOS PMOS1 with its source SP1 connected to voltage supply 622, its gate GP1 connected to drain control signal line 624 and its drain DP1 connected (e.g., through network 612) to drain D of the HEMT. Wafer 110 of circuit 600 is shown having CMOS NMOS1 with its drain DN1 connected to gate voltage supply 632, its gate GP1 connected to gate control signal line 634 and its source SN1 connected (e.g., through network 612) to gate G of the HEMT.

Circuit 602 shows compound semiconductor chiplet 130*a* bonded to chiplet 110 by lateral bonding material 360. Circuit 602 shows interconnects 510 over or on material 360 connecting the HBT (e.g., circuitry of chiplet 130*a*) to circuitry of the wafer 110. Wafer 110 of circuit 602 is shown having matching network 652, such as passive capacitors, inductors, resistors and connections to ground, connected through heterogeneous interconnects 510 to the HBT (e.g., circuitry of chiplet 130*a*). Wafer 110 of circuit 602 is shown having RF input signal line 682 and RF output signal line 684 connected (e.g., through network 652 and) through interconnects 510 to the base B and collector C of the HBT, respectively.

Wafer 110 of circuit 602 is shown having CMOS PMOS2 with its source SP2 connected to collector voltage supply 662, its gate GP2 connected to collector control signal line 664 and its drain DP2 connected (e.g., through network 652) to collector C of the HBT. Wafer 110 of circuit 602 is shown having CMOS NMOS2 with its drain DN2 connected to base voltage supply 672, its gate GP2 connected to base control signal line 674 and its source SN2 connected (e.g., through network 652) to base B of the HBT.

Reference herein to circuitry being "connected" is or includes that circuitry being electrically connected such as to transfer RF signals and/or DC biasing signals, possibly using interconnects, pads, traces and/or wiring. Being electrically connected may include having electrical connections through printed circuit boards, interposers, chiplets, chips, wafers and/or lateral bonding material.

Interconnects 510 may be shown as a dark square or rectangle that represents all of the interconnects 510 between the RF transistors (e.g., HEMT or HBT) and the network 612 or 652 such as shown in the figures where the connecting line is thickened at lateral material 360 between the RF transistors (e.g., HEMT or HBT) and the network 612 or 652.

In some cases, the HEMT and HBT chiplets 130*b* and 130*a* are interconnected to the wafer 110 circuits (e.g., fabricated in a silicon wafer) through metal bridged interconnects 510 with passive elements forming arbitrary matching networks 612 and 652 at the input and output of the RF circuits of the chiplets. A number of HEMTs and/or HBTs might be connected within a single integrated circuit or diced chip having CMOS circuitry of wafer 110, such as for optimizing (e.g., tuning) operating conditions of the chiplet RF transistors. The CMOS transistors NMOS1 and NMOS2 are used to moderate the gate G and base B voltages by providing more stable and noiseless DC bias voltages to the gate G and base B. The CMOS transistor PMOS1 and PMOS2 are used to set the drain D and collector C voltages by providing more stable and noiseless DC bias voltages to the drain D and collector C, such as through the action of a feedback circuit that compares the desired voltage to a reference value.

Use of the CMOS transistors of FIG. 6 is important because the different chiplet RF transistor devices (e.g., HEMT and HBT) require different DC biasing conditions and the on-chiplet monitoring of the RF transistors is critical to get the best performance from each RF transistor device. The passive elements for matching networks 612 and 652 are designed to produce a desired circuit response of the RF transistor devices in terms of gain, bandwidth, noise, linearity, output power, and/or noise.

The HEMT source S and HBT emitter E signals, respectively, are split into two matching networks 612 and 652 (e.g., to ground) to reduce the inductance at each of these transistor terminals. The gate G and base B signals are connected to the left through matching networks 612 and 652 to inputs 642 and 682. The drain D and collector C signals are connected on the right through matching networks 612 and 652 to outputs 644 and 684. The DC bias current signals are introduced to the gate G and base B. The drain D and collector C signals are connected through inductors connected to separate supply voltages 622 and 662. Alternatively, a choke circuit element such as a quarter-wave transmission line or large DC resistor may be introduced as a DC circuit element. The choke circuit produces a large impedance at a fixed frequency and harmonics of the fixed frequency while allowing the DC voltage and/or current to pass unimpeded from the supply. The active bias generation produces a small impedance near DC or at low frequency while the choke circuit produces a large impedance.

In some cases, silicon-based NMOS transistor (e.g., NMOS 1 and 2) can be used to moderate the gate and base voltages and a silicon-based PMOS transistor (e.g., PMOS 1 and 2) can be used to moderate the drain and collector voltages. One purpose of the NMOS transistor is to illustrate a "voltage source" local to the wafer 110 (e.g., a silicon interposer) and close in proximity (such as within 100 um distance) to the HEMT or HBT such that the closeness introduces a low-impedance from DC to a frequency near or below the signal bandwidth of the RF chiplet transistors, such as from DC to a frequency of 100 to 10000 MHz. The purpose of the PMOS transistor may be to illustrate or provide a "current source" local (such as within 100 um distance) to the silicon wafer 110 and close in proximity (such as within 100 um distance) to the HEMT or HBT that introduces a high impedance from DC to a frequency near or below the signal bandwidth of the RF chiplet transistors, such as from DC to a frequency of 100 to 10000 MHz.

In some cases, NMOS1 can be implemented using a PMOS transistor, such as to perform the same function as NMOS1.

Figure 7:
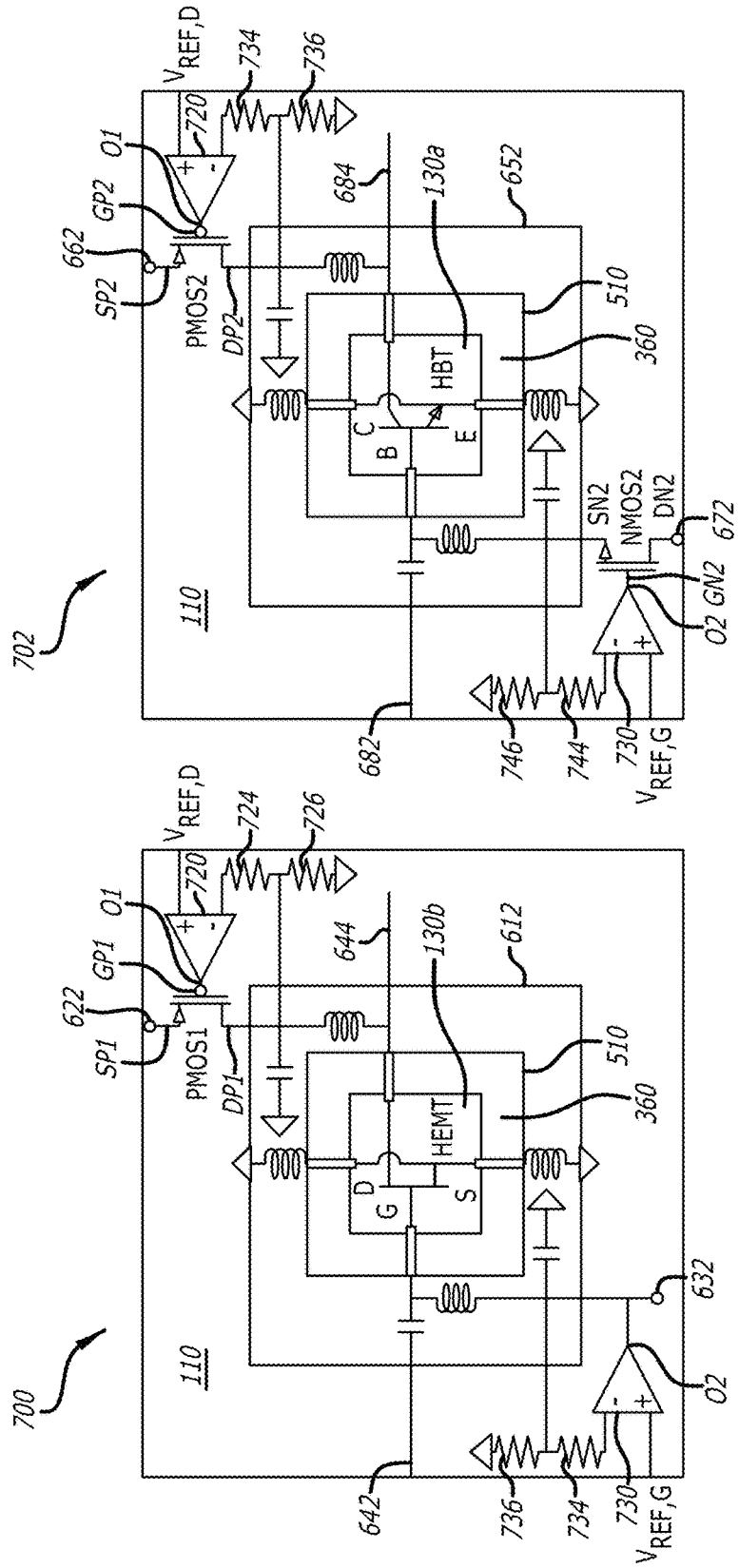
FIG. 7 shows a top view of a breakdown of two circuits each including a CMOS-based wafer having feedback operational amplifiers; and a HEMT of a chiplet that is heterogeneous integrated into the wafer.

FIG. 7 shows a top view of a circuit diagram breakdown of circuits 700 and 702 each including a CMOS-based wafer 110 (e.g., a silicon interposer) having at least one of feedback operational amplifiers 720 and 730; and a HEMT of chiplet 130*b* on the left at circuit 700 or a HBT of chiplet 130*a* on the right at circuit 702 that are heterogeneous integrated into wafer 110. Circuits 700 may be similar to circuit 600 except that circuit 700 also includes the feedback operational amplifiers 720 and 730 having outputs O1 and O2 connected to gates GP1 and G, respectively. Circuit 702 may be similar to circuit 602 except that circuit 702 also includes the feedback operational amplifiers 720 and 730 having outputs O1 and O2 connected to gates GP1 and GN1, respectively. Note that the NMOS1 and PMOS1 transistors in FIG. 7 are shown left to right reverse oriented as compared to that shown in FIG. 6.

Wafer 110 of circuit 700 is shown having operational amplifier (OP amp) 720 with output O1 connected to gate GP1, positive input connected to drain reference voltage $V_{REF, D}$ and negative input connected to an output end of resistor 724. An input end of resistor 724 is connected through resistor 726 to a ground signal; is connected (e.g., through network 612) to drain D of the HEMT and to a ground signal; and is directly connected to source SP1 of PMOS1.

Wafer 110 of circuit 700 obviates the need for NMOS1 since the gate of the HEMT may not require current. Thus, wafer 110 of circuit 700 is shown having OP amp 730 with output O2 connected (e.g., through network 612) to gate G of the HEMT. Here, OP amp 730 has positive input connected to gate reference voltage $V_{REF, G}$ and negative input connected to an output end of resistor 734. An input end of resistor 734 is connected through resistor 736 to a ground signal; is connected (e.g., through network 612) to gate G of the HEMT and to a ground signal; and is directly connected to output O2 of OP amp 730.

Wafer 110 of circuit 702 is shown having operational amplifier (OP amp) 720 with output O1 connected to gate GP2, positive input connected to drain reference voltage $V_{REF, D}$ and negative input connected to an output end of resistor 734. An input end of resistor 734 is connected through resistor 736 to a ground signal; is connected (e.g., through network 612) to collector C of the HBT and to a ground signal; and is directly connected to source SP2 of PMOS2.

Wafer 110 of circuit 702 is shown having OP amp 730 with output O2 connected to gate GN2, positive input connected to gate reference voltage $V_{REF, G}$ and negative input connected to an output end of resistor 744. An input end of resistor 744 is connected through resistor 746 to a ground signal; is connected (e.g., through network 612) to base B of the HBT and to a ground signal; and is directly connected to drain DN2 of NMOS2.

The OP amps 730 and/or 720 of circuits 700 and 702 provide feedback elements to sense the gate/base and drain/collector DC bias voltage of the HEMT and HBT. An error signal between the drain/collector at the negative input of the OP amp 720, and the reference voltage $V_{REF, D}$ at the positive input of the OP amp 720 is amplified in the OP amp 720 and the resulting OP amps output O1 and is used to generate a DC bias of the drain D or collector C using the source SP1 or SP2 of the PMOS1 or PMOS2 transistor. The error voltage signal at OP amp 720 may cause the output O1 to generate a change in the gate GP1 or GP2 of the PMOS1 or PMOS2 that adjusts for a perturbation in the error signal of the DC bias for the HEMT drain or HBT collector. In other words, if the drain voltage supply 622 of circuit 700 drops locally on the wafer 110 (or at the drain D), the feedback amplifier OP amp 720 senses the drop and feeds back an increased or high enough voltage that increases the delivered drain voltage at D to make up for the drop and keep the DC bias drain voltage stable during the drop. If the collector voltage supply 662 of circuit 702 drops locally on the wafer 110 (or at the collector C), the feedback amplifier OP amp 720 senses the drop and feeds back an increased or high enough voltage that increases the delivered collector voltage at C to make up for the drop and keep the DC bias collector voltage stable during the drop. Since the action of the feedback changes the current produced in response to sensing the voltage, the impedance presented by the PMOS is low.

Also, or separately, an error signal of circuit 700 between the gate at the negative input of the OP amp 730, and the reference voltage $V_{REF, G}$ at the positive input of the OP amp 730 is amplified in the OP amp 730 and the resulting OP amp output O2 is used to generate a DC bias of the gate G.

Also, or separately, an error signal of circuit 702 between the base at the negative input of the OP amp 730, and the reference voltage $V_{REF, G}$ at the positive input of the OP amp 730 is amplified in the OP amp 730 and the resulting OP amp output O2 is used to generate a DC bias of the base B using the drain DN2 of the NMOS2.

The error voltage signal at OP amp 730 of circuit 700 may cause the output O2 to generate a change in the gate G that adjusts for a perturbation in the error signal of the DC bias for the HEMT gate. In other words, if the gate voltage supply 632 drops locally on the wafer 110 (or at the gate G), the feedback amplifier OP amp 730 senses the drop and feeds back an increased or high enough voltage that increases the delivered gate voltage at G to make up for the drop and keep the DC bias gate voltage stable during the drop. The error voltage signal at OP amp 730 of circuit 702 may cause the output O2 to generate a change in the gate GN2 of the NMOS2 that adjusts for a perturbation in the error signal of the DC bias for the HBT base. In other words, if the base voltage supply 672 drops locally on the wafer 110 (or at the base B), the feedback amplifier OP amp 730 senses the drop and feeds back an increased or high enough voltage that increases the delivered base voltage at B to make up for the drop and keep the DC bias base voltage stable during the drop. The gate and/or base voltage might be stabilized according to (e.g., with respect to or to compensate for) a change in the temperature of the device, a shift in the transistor parameters or characterization, the input power or output power that reflects the linear region of operation for the transistor and other performance characteristics directly influenced by the gate bias.

Advantages of using OP amps 730 and/or 720 include that they are on-wafer 110 proximate to the chiplet transistors, such as described for the CMOS transistors of FIG. 6. That is, OP amps 730 and/or 720 may be local to the chiplet 130b or 130a, such as within 50-400 microns (or say within 100 microns) distance from the chiplet. Being this local will reduce unwanted impedance, noise, capacitance and inductance in the signal line or signal from the OP amps, such as at a frequency near the signal bandwidth of the RF chiplet transistors.

In some cases, the hybridization of CMOS transistors in the wafer 110 and RF transistors in the chiplets can use a low-dropout voltage regulator in place of any or all of the shown PMOS1 or 2; NMOS1 or 2; voltage supplies for the gate, drain, base and/or collector. In this case, the low-dropout voltage regulator can control the DC bias voltage supplies for the gate/drain and/or base/collector of the compound semiconductor device HEMT and/or HBT transistors integrated of the chiplets in the same substate of wafer 110. The low drop-out regulator reduces the lost DC power at the drain D or collector C while producing a low-impedance at the drain or collector to optimize the ability of the transistor to respond to a perturbation in the voltage within the signal bandwidth without changing the supply presented to the transistor. A low drop-out regulator can similarly reduce the lost DC power at the gate G or base B.

Figure 8:
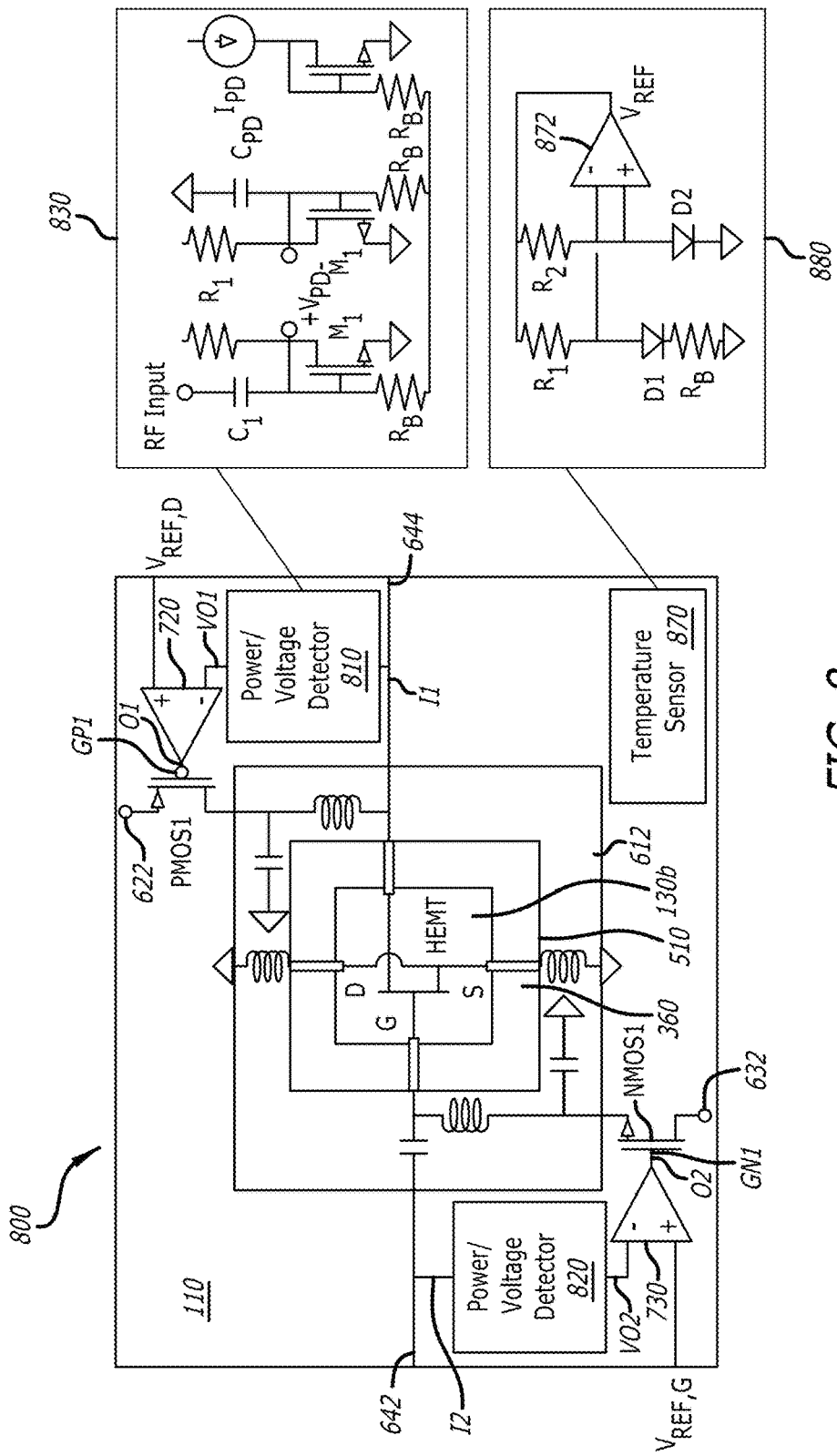
FIG. 8 shows a top view of a breakdown of a circuit including a CMOS-based wafer having power/voltage detectors and a temperature sensor 870; and a HEMT of a chiplet that is heterogeneous integrated into the wafer.

FIG. 8 shows a top view of a circuit diagram breakdown of circuit 800 including a CMOS-based wafer 110 (e.g., a silicon interposer) having power detectors 810 and 820, also potentially voltage or current detectors, and temperature sensor 870; and a HEMT of chiplet 130b that is heterogeneous integrated into wafer 110. Circuit 800 includes feedback OP amplifiers 720 and 730 having outputs O1 and O2 connected to gates GP1 and GN1, respectively. Circuit 800 may be similar to circuit 700 except that circuit 800 uses power/voltage detector 810 in place of resistors 724 and 726 for the negative input to the OP amp 720, uses power/voltage detector 820 in place of resistors 734 and 736 for the negative input to the OP amp 730, and has temperature sensor 870. Either or both of detectors 810 and 820 can be a power detector or a voltage/current detector. Either power/voltage detector can be replaced with the prior resistor setup of FIG. 7. The temperature sensor may be optional and provides a reference that might be provided for the $V_{REF,G}$ and/or $V_{REF,D}$ signals shown in the circuit.

Power/voltage detector 810 has input I1 connected to RF output 644 and output VO1 connected to the negative input to the OP amp 720. Power/voltage detector 820 has input I2 connected to RF input 642 and output VO2 connected to the negative input to the OP amp 730.

Each of power/voltage detectors 810 and 820 are represented by expanded circuit diagram 830. For detectors 810 and 820, the "RF Input" of diagram 830 is RF output 644 or RF input 624, and the "VPD" diagram 830 is the negative input VO1 or VO2 to OP amp 720 or 730, respectively.

Circuit 800 indicates how power or voltage detectors 810 and 820 can use a feedback element such operational amplifiers 720 and 730 to amplify the difference between desired voltages $V_{REF,D}$ and $V_{REF,G}$ and a measured voltage VO1 and VO2, and apply the connection through a CMOS transistor of wafer 110 at the drain D of the HEMT chiplet for PMOS1 and the gate G of the HEMT chiplet for NMOS 1, respectively.

Diagram 830 shows how each power detector 810 and 820 is constructed from a diode-connected transistor M1 that is driven through high-frequency capacitor C1. Based on the ratio of the capacitance of capacitor C1 as compared to the gate to source capacitance of transistor M1, the voltage change at VPD (e.g., VO1 and VO2) will be stronger or weaker at a certain power level at the RF Input. Transistor M1 may be NMOS transistors such as NMOS1. Circuit 800 and diagram 830 show how an RF block such as a power detector or voltage detector 810 or 820 can be integrated as part of the matching network 612 or bonding interface. A feedback element such as an operational amplifier 720 or 730 can amplify the error signal between a desired (reference) voltage and the measured voltage VO1 or VO2 and apply the correction through a transistor PMOS1 or NMOS1 at either the drain D or gate G.

The reference voltage for sensing the RF power might be derived from the bandgap reference illustrated in diagram 870 or 880. The principle of the bandgap voltage reference is to balance the negative temperature coefficient of a PN junction, such as of the OP amp and/or HEMT, with the positive temperature coefficient of the thermal voltage, $Vt=kT/q$. The bandgap reference produces a voltage that changes by no more than 3-5 mV over a range of temperatures from −70 to 250 C. A desired coefficient of voltage change as a function of temperature is achieved with a balance of the positive and negative temperature coefficient. This implementation of the power detector achieves extremely small area and can be integrated at many locations along the RF signal paths 642 or 644 due to the beneficial low-capacitance that it presents. The extremely small area may have a length and width of between 10-100 microns based on the frequency of operation.

Advantages of using detectors 810 and 820 include that they are on wafer 110 proximate to the chiplet transistors, such as described for the CMOS transistors of FIG. 6. That is, detectors 810 and 820 may be local to the chiplet 130b, such as within 50-400 microns (or say within 100 microns) distance from the chiplet 130b. Being this local will reduce unwanted impedance, noise, capacitance and inductance in the signal line or signal from the detectors and the OP amps, such as at a frequency near the signal bandwidth of the RF chiplet transistors. Detecting the power and voltage as close to the transistor on the chiplet 130b improves the RF characteristics of the circuit, such as output power, gain, and efficiency.

Either or both of FET transistors M1 can be replaced with a bipolar junction transistor (BJT) having its base tied directly to its collector similar to the tie of the M1 gate to its source.

Temperature sensor 870 is represented by expanded circuit diagram 880. Diagram 880 shows how reference voltage $V_{REF}$ output by OP amp 872 can be constructed from the OP amp inputs of temperature sensor 870, using unequal diodes D1 and D2 with feedback resistors R1 and R2. The p-n diodes D1 and D2 are made unequal due to diode D1 having a larger geometry than diode D2 but have approximately the same current. The diodes have a negative temperature coefficient with respect to the forward voltage across the diode for a fixed current. The larger diode D1 has a smaller forward voltage than diode D2 and the difference in the voltages across the diodes has a positive temperature coefficient. Resistor RB compensates for the smaller voltage across D1 relative to diode D2. The OP amp forces the voltage input terminals to be equal to the same voltage and therefore connection of the unequal diodes to the emitter signal line may be an electrical connection and/or thermal connection. Voltage $V_{REF}$ may be used as voltage $V_{REF,D}$ and/or $V_{REF,G}$.

Sensor 870 may be an environmental detector to sense the temperature of the compound semiconductor transistor of the chiplet within the silicon substrate wafer 110. Here, a reference voltage $V_{REF}$ is produced from a silicon-based temperature sensor 870 on the wafer 110 using unequal p-n diodes D1 and D2 with feedback operational amplifier OP amp 872 to supply current to the two diodes. This circuit 870 may be a bandgap reference that is adopted from other circuit techniques such as a Widlar bandgap that can be adapted to measure the temperature of the HEMT or HBT of chiplet 130B or 130a due to the ability to integrate this sensor in the wafer 110 close to the chiplet.

Advantages of using sensor 870 includes that it is on wafer 110 proximate to the chiplet transistors, such as described for the CMOS transistors of FIG. 6. That is, sensor 870 may be local to the chiplet, such as within 50-400 microns (or say within 100 microns) distance from the chiplet. Being this local will reduce any error between the temperature detected by sensor 870 and the actual temperature of the chiplet or chiplet transistor, thus improving accuracy of the DC bias reference voltage $V_{REF}$.

The techniques of circuit 800 can be used to improve accuracy of DC biases of the HBT of chiplet 130a. For example, the power/voltage detectors 810 and 820 can provide feedback elements to provide negative inputs to the OP amps 720 and 730, respectively, for improved accuracy of base and collector DC bias voltage of the HBT. Also, temperature sensor 870 can provide feedback elements to provide positive reference voltage inputs to the OP amps 720 and 730 for improve accuracy of base and collector DC bias voltage of the HBT.

Figure 9A:
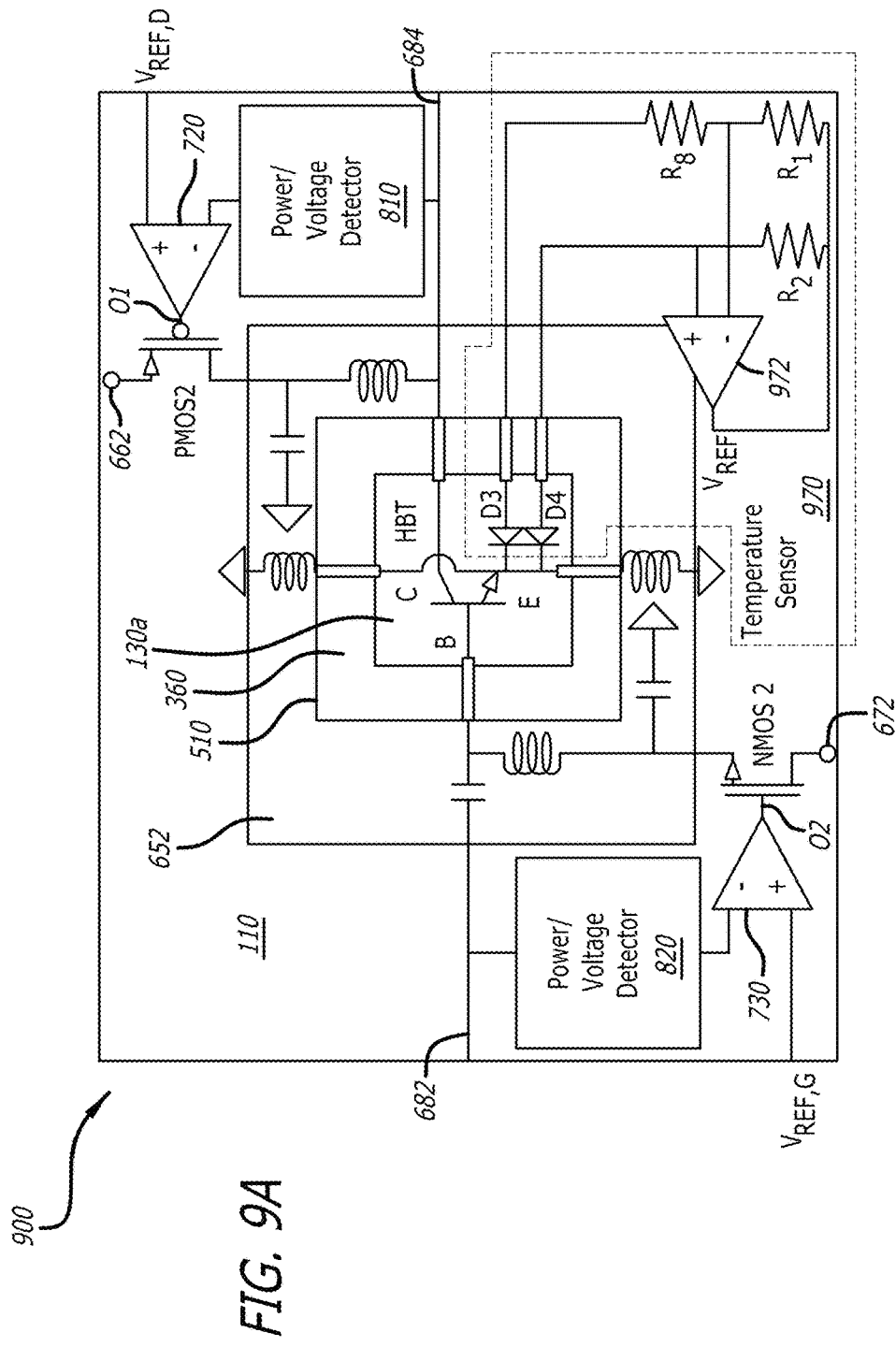
FIGS. 9A and 9B show top views of breakdowns of circuits including a CMOS-based wafer having part of a temperature sensor; and a HBT of a chiplet that has another part of the temperature sensor and is heterogeneous integrated into the wafer.

FIG. 9A shows a top view of a circuit diagram breakdown of circuit 900 including a CMOS-based wafer 110 (e.g., a silicon interposer) having part of a temperature sensor 970; and a HBT of chiplet 130a that has another part of the temperature sensor 970 and is heterogeneous integrated into wafer 110. Circuit 900 includes feedback operational amplifiers 720 and 730 having outputs O1 and O2 connected to gates GP2 and GN2 of PMOS2 and NMOS2; and power/voltage detectors 810 and 820 outputting VO1 and VO2 to the negative inputs of the amplifiers 720 and 730, respectively. Circuit 900 may be similar to circuit 602 except that circuit 900 uses the OP amps 720 and 730; power/voltage detectors 810 and 820; and temperature sensor 970. Circuit 900 may be similar to circuit 800 except that circuit 900 has the HBT instead of HEMT; and uses sensor 970 instead of sensor 870.

Temperature sensor 970 shows how reference voltage $V_{REF}$ output by OP amp 972 can be constructed from the OP amp inputs of temperature sensor 970, using unequal diodes D3 and D4 on the chiplet 130a and connected to the HBT emitter E signal line, with feedback resistors R1 and R2. The p-n diodes D3 and D4 are unequal due to diode D3 having a larger geometry than diode D4. Diode D3 may be larger by 4×, 8×, 16× than diode D4. Given similar current in D3 and D4, the larger diode D3 has a smaller forward voltage than diode D4 and resistors RB may be used to offset the voltage difference. The connection of the unequal diodes to the emitter signal line may be an electrical connection and/or thermal connection. Voltage $V_{REF}$ may be used as voltage $V_{REF, D}$ and/or $V_{REF, G}$. The diodes sense the temperature difference on the chiplet while the feedback circuitry is located on the host CMOS wafer.

Figure 9B:
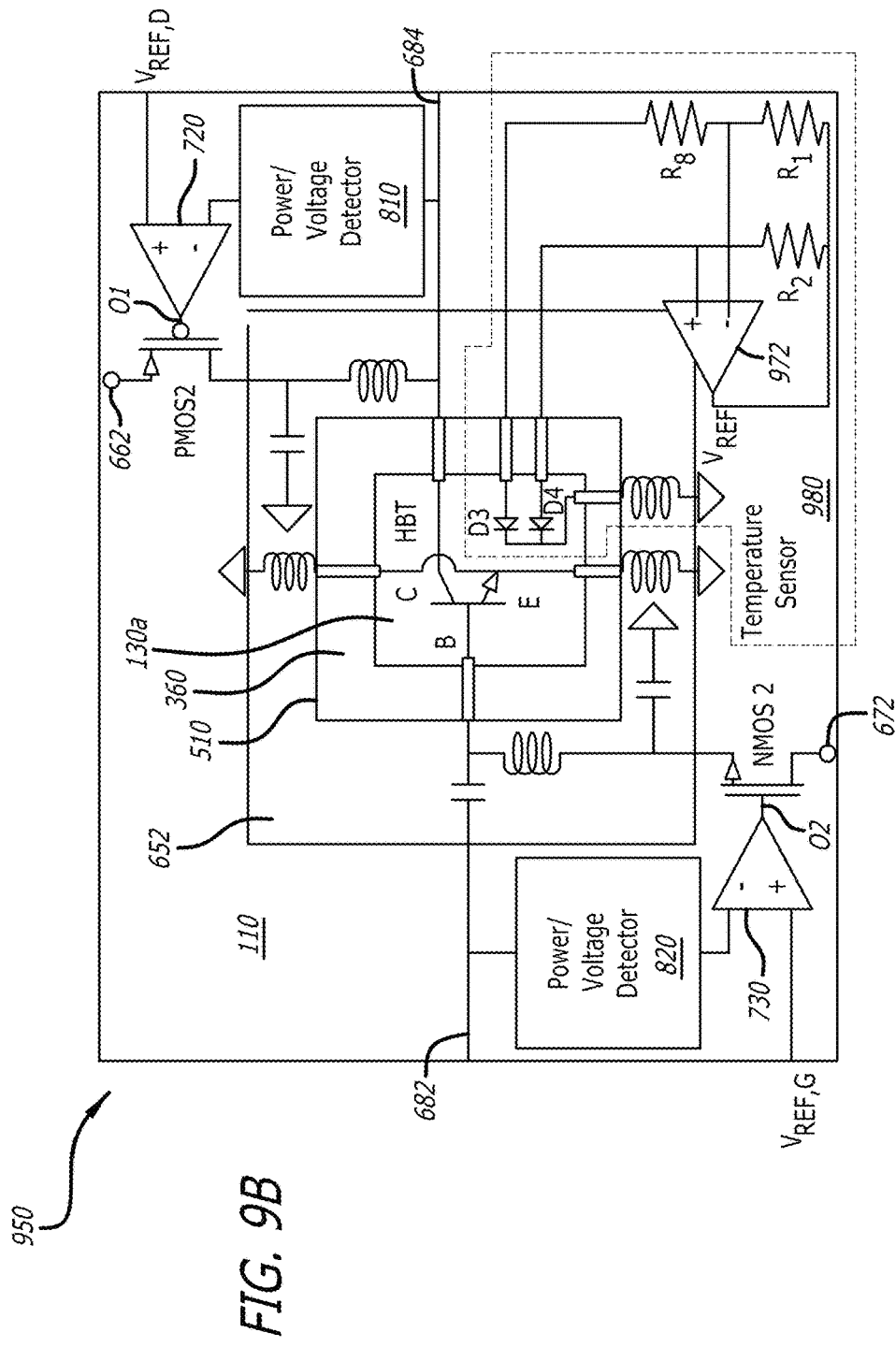

FIG. 9B shows a top view of a circuit diagram breakdown of circuit 950 including a CMOS-based wafer 110 (e.g., a silicon interposer) having part of a temperature sensor 980; and a HBT of chiplet 130a that has another part of the temperature sensor 980 and is heterogeneous integrated into wafer 110. Circuit 950 is similar to circuit 900, except that circuit 950 has the diodes D3 and D4 electrically isolated from the signal line connected to the HBT emitter E. That is, there is no signal between the diodes and the emitter or the signal line from the emitter to ground. Thus, circuit 950 reduces or eliminates capacitance that the diodes D3 and D4 load on the emitter E. The reduction or elimination creates cleaner, better and/or less noisy performance of the HBT.

Temperature sensor 980 shows how reference voltage $V_{REF}$ output by OP amp 972 can be constructed from the OP amp inputs of temperature sensor 980, using unequal diodes D3 and D4 on the chiplet 130a and not connected to the HBT emitter E signal line, with feedback resistors R1 and R2. The p-n diodes D3 and D4 are unequal, the larger diode D3 has a smaller forward voltage than diode D4 and resistors RB may be used to offset the voltage difference. There is no connection of the unequal diodes to the emitter signal line, thus there is no electrical connection and/or thermal connection. The diodes sense the temperature difference on the chiplet while the feedback circuitry is located on the host CMOS wafer. The signal line from the diodes to ground may be attached to a thermal pad on the chiplet.

Using sensor 970 or 980 instead of sensor 870 provides an improvement on the temperature sensor 870, because the unequal diodes D3 and D4 are implemented on the chiplet to improve the accuracy of the temperature monitoring by sensor 970 or 980 as compared to diodes D1 and D2 on the wafer 110. The reference voltage $V_{REF}$ generated from the temperature center 970 or 980 can be used to provide a reference voltage $V_{REF, D}$ and $V_{REF, G}$, to both the drain and gate bias circuitry, such as to positive inputs of OP amps 720 and 730.

Instead of for the HBT shown in FIGS. 9A-9B, the techniques of circuit 900 and 950 can also or alternatively be used to improve accuracy of DC biases of the HEMT of chiplet 130b. For example, the temperature sensor 970 or 980 can provide feedback elements to provide positive inputs to the OP amps 720 and 730 for improved accuracy of drain D and gate G DC bias voltage of the HEMT.

Using sensor 970 or 980 instead of sensor 870 provides an improvement on the temperature sensor 870 and other temperature sensors, because sensor 970 or 980 leverages heterogeneous devices of wafer 110 and the chiplet to move the p-n unequal diodes from the CMOS of wafer 110 to the compound semiconductor chiplet 130a or 130b. The benefit of this approach is that the p-n diodes are closer to the chiplet transistor and therefore a far more precise representation of the temperature on the chiplet. Now the feedback amplifier 972 is realized using the silicon CMOS transistors of wafer 110 and reflects the same core operation as the bandgap reference circuit 800. Having amplifier 972 and the resistors of sensor 970 or 980 on wafer 110 provides the advantages noted herein of CMOS devices on a wafer local to the chiplets and their transistors; and cheaper fabrication and size use of Si wafer CMOS devices instead of CMOS devices on the more expensive to use area one and fabricate CMOS on chiplet semiconductor material.

Figure 10:
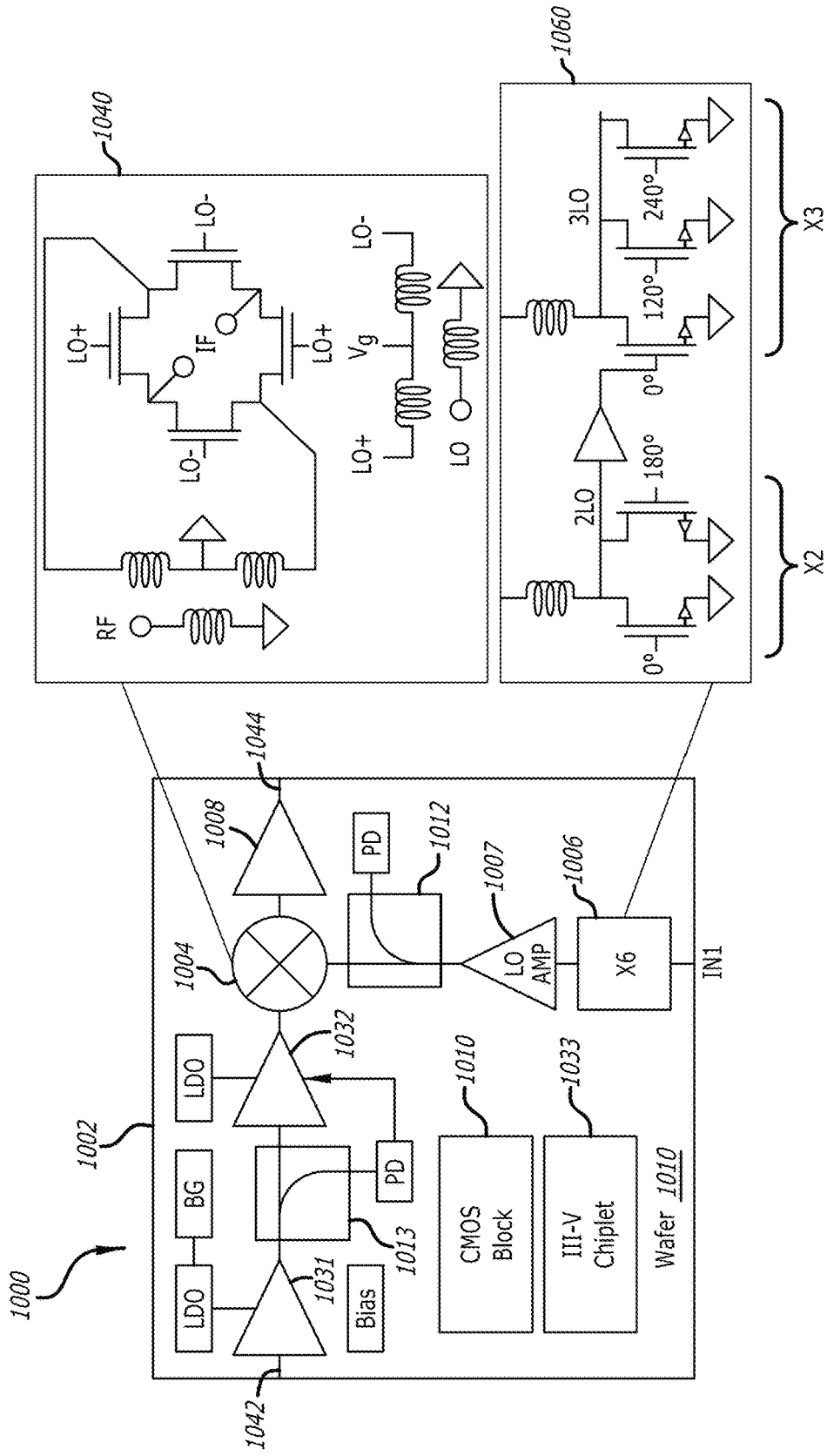
FIG. 10 shows a block diagram of a radio receiver including a CMOS-based wafer having chiplet compound semiconductor devices heterogeneous integrated into the wafer.

FIG. 10 shows a block diagram 1000 of a radio receiver 1002 (e.g., a product) including CMOS-based wafer 1010 (e.g., a silicon interposer) having chiplet compound semiconductor devices 1031, 1032 and 1033 (and optionally local oscillator driver or amplifier—LO Amp 1007) heterogeneous integrated into wafer 1010. Wafer 1010 may be a chip or integrated circuit diced from a wafer 110. Each of device blocks 1031, 1032 and 1007 may be chiplet 130a and/or 130b. Each of device blocks 1031, 1032 and 1007 may be a low noise RF amplifier. Each block other than device blocks 1031, 1032 and 1007 may be CMOS or other wafer 110 based technology.

Diagram 1000 may be or include a radio-frequency (RF) or millimeter-wave receiver 1002 that might be completely integrated within a chip or integrated circuit of or diced from a wafer 110. Receiver 1002 has RF input 1042 such as connected to an RF antennae and output 1044 such as outputting a baseband output.

The blocks of receiver 1002 or wafer 1010 would ideally be selected for performance constraints such as gain, noise, linearity, power consumption, and/or bandwidth and using the embedding approach illustrated in FIG. 6. The blocks of receiver 1002 or wafer 1010 could be used to incorporate a diverse portfolio of device technologies such as a GaN, GaAs or InP HEMTs for the first 1-3 stages of the low noise amplifier shown as blocks 1031 and 1032 (and optionally 1007). The amplifier stages may be constructed from two different technologies. Other device technologies such as a GaN, GaAs or InP HBT might be integrated for higher gain or output power RF amplifier blocks. For example, blocks 1031 and 1032 may be InP HEMT chiplets; while the LO Amp 1007 might be an InP HBT amplifier or a InP HEMT amplifier. In some cases, blocks 1031 and 1032 may be in one or more chiplets 130b; while the LO Amp 1007 may be in a chiplet 130a. The block diagram 1000 illustrates how the components previously described such as in FIGS. 6-9 including the bias generators such as PMOS1-2 and NMOS1-2, feedback circuitry such as OP amps 720 and 730, and power detectors such as detectors 810 and 820 (and temperature sensors such as sensor 870 and/or 970) can be organized into the receiver product 1002 that is fully integrated into a single substrate 1010 with chiplet compound semiconductor transistor devices.

The bias generators such as PMOS1-2 and NMOS1-2 of FIGS. 6-9 may be shown as blocks "Bias" and "BG" for improved DC biasing of transistors of chiplet blocks 1031, 1032 and 1033. The feedback circuitry such as OP amps 720 and 730 of FIGS. 7-9 may be shown as blocks "supply modulator", "LDO" and "BG" for improved DC biasing of transistors of chiplet blocks 1031, 1032 and 1033. The power detectors such as detectors 810 and 820 of FIGS. 8-9 may be shown as blocks "PD" for improved DC biasing of transistors of chiplet blocks 1031, 1032 and 1033. The temperature sensors such as sensor 870 and/or 970 of FIGS. 8-9 may be part of any of the chiplet blocks and/or wafer blocks for improved DC biasing of transistors of chiplet blocks 1031, 1032 and 1033.

Additionally, a CMOS mixer 1004 and multiplier 1006 can be realized as radio frequency blocks that support the heterogeneous integration of transistor technologies into a complex circuit such as a receiver 1002 or transmitter. That is, concepts similar to those described for diagram 1000 may be used to design a corresponding transmitter.

Diagram 1000 includes expanded diagram 1040 of the CMOS mixer 1004. Diagram 1040 shows mixer 1004 having "RF", "IF", "LO", and "Vg" which separately provide bias to the gate and the drain of the FET. In some cases, "Vg" separately provides bias Vg and Vd to the gate and the drain of the HEMT. Diagram 1040 shows mixer 1004 having inputs at RF, LO, LO+ and LO−, and an IF. Mixer 1004 may be a frequency down-conversion mixer such as stepping down from 80 GHz to a lower band around 9 GHz. Receiver 1002 has input IN1 connected to the mixer 1004. The output of mixer 1004 is connected to a baseband amplifier 1008 which provides output 1044.

Diagram 1000 includes expanded diagram 1060 of the CMOS multiplier 1006. Diagram 1060 shows multiplier 1006 having "X2" or "2LO", and "X3" or "3LO" circuit parts connected by an OP local oscillator amp to create a 6× frequency multiplication output from the cascaded or multiplied 2 then 3-fold frequency multiplication of the input LO frequency (IN1). Diagram 1000 shows 6-fold multiplier 1006 that might be developed from two separate multipliers (X2) and (X3) with separate multiplication ratios (2-fold) and (3-fold) having 0 degree and 180 degree phase inputs for the X2 multiplier and 0 degree, 120 degrees, and 240 degrees for the X3 multiplier. Diagram 1000 shows multiplier 1006 having output around 71 GHz. This allows frequency conversion of 80 GHz to 9 GHz. The output of multiplier 1006 is connected to the LO amplifier 1007 that produces sufficient power to drive the input of mixer 1004. This connection includes trap 1012 that extracts the output signal from multiplier 1006 going to mixer 1004 and passes it to a power detector PD. Similarly, the output of block 1031 is input to trap 1014 that extracts the output signal and passes it to a power detector PD.

Diagram 1000 shows "CMOS Block" that include the power detector, the mixer, the LDO, BG, bias circuitry, and frequency multiplier, and BB amplifier.

Diagram 1000 shows "III-V Chiplet" block such as for the low-noise amplifier blocks such as 1031 and 1032, and LO driver amplifier blocks in amplifier 1007.

Having radio receiver 1002 on wafer 110 or chip 1010 provides the advantages noted herein of CMOS devices on a wafer local to the chiplets and their transistors; and cheaper fabrication and size use of Si wafer CMOS devices instead of CMOS devices on the more expensive to use area one and fabricate CMOS on chiplet semiconductor material.

Figure 11:
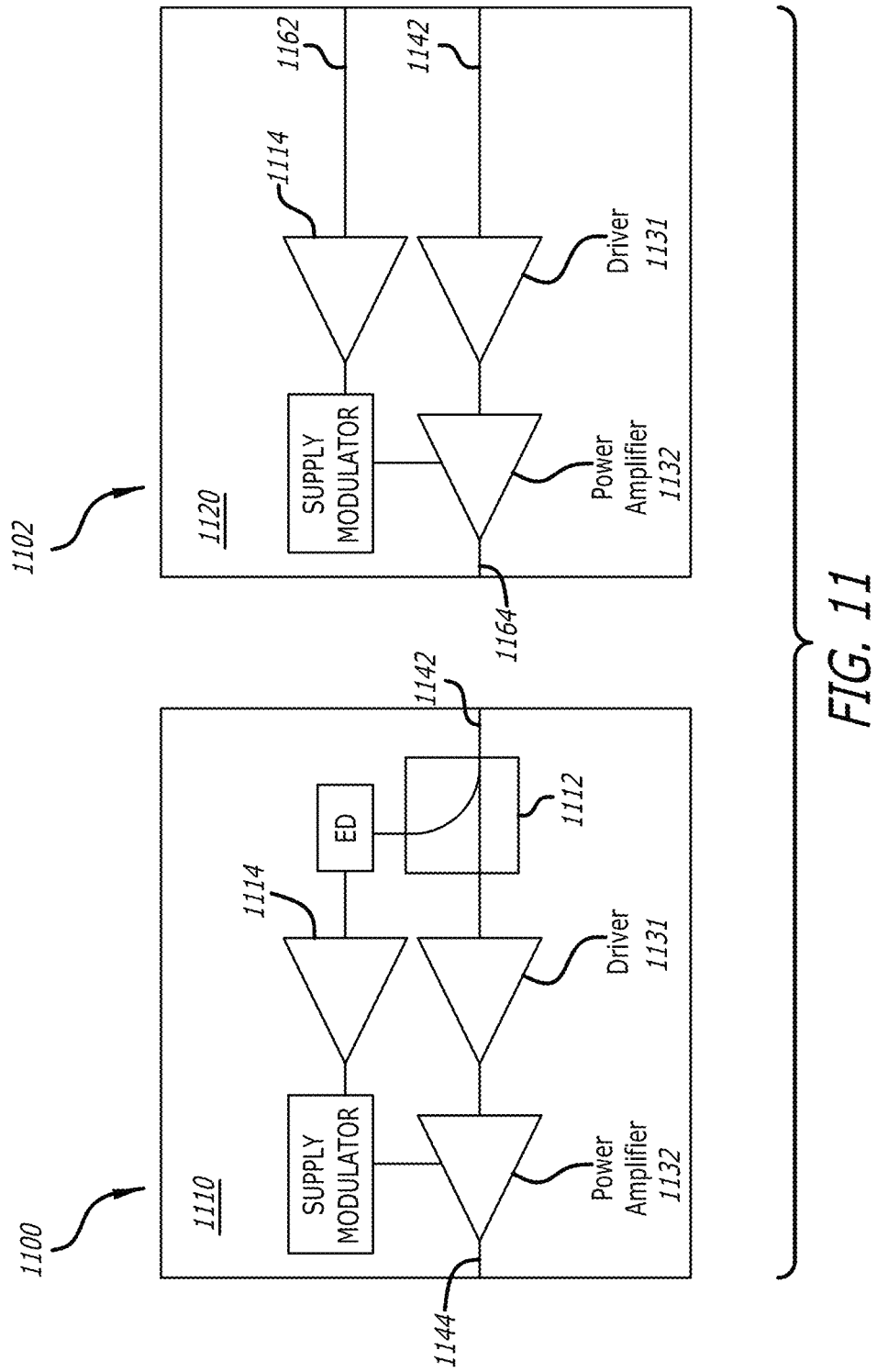
FIG. 11 shows a block diagram of envelope detector (ED) circuits each including a CMOS-based wafer; and each having chiplet compound semiconductor devices heterogeneous integrated into the wafer.

FIG. 11 shows a block diagram 1100 of envelope detector (ED) circuits 1100 and 1102 each including a CMOS-based wafer 1110 and 1120 (e.g., a silicon interposer); and each having chiplet compound semiconductor devices 1131 and 1132 heterogeneous integrated into the wafer 1110 and 1120, respectively. Each circuit 1100 and 1102 may be part of a radio (e.g., a product) such as part of radio receiver 1002. Each of wafers 1110 and 1120 or a radio they are part of may be a chip or integrated circuit diced from a wafer 110. Each of device blocks 1131 and 1132 may be chiplet 130a and/or 130b. Each of device blocks 1131 and 1132 may be a low noise RF amplifier. Block 1131 may be an RF driver and block 1132 may be an RF power amplifier. Any of the chiplet power amplifiers 1132 and drivers 1131 of circuits 1100 and 1102 may be any of the circuits of FIGS. 6-9. Each block other than device blocks 1131 and 1132 may be CMOS or other wafer 110 based technology.

Circuits 1100 and 1102 may indicate two alternative schemes or heterogeneous circuits for a power amplifier that use a CMOS envelope detector (ED) in circuit 1100 to extract, or input separately in circuit 1102, the time-varying amplitude envelope of the RF signal 1142, amplify the envelope at envelope amplifier 1114, and use the amplified envelope to modulate an envelope modulator shown here as a supply modulator, such as a low dropout regulator LDO. The supply modulators receiving the output of amplifiers 1114 may be envelope modulators that are each connected to each of the amplifiers 1132 to modulate the envelope output by the amplifiers 1132, such as by driving the supply of (or providing a bias signal to) the amplifiers 1132. Thus, these supply modulators may function or look like LDOs.

Circuit 1100 illustrates an envelope modulation that traps the input RF signal at trap 1112 and extracts the envelope of the signal going to block 1131 through an envelope detector ED. The envelope at ED is amplified through the CMOS envelope amplifier 1114, and provided to a DC bias supply such as the supply modulator. The output of the supply modulator and block 1131 are input to block 1132 which provides output 1144 based on those inputs. The amplifier 1114 and/or ED may include Si CMOS transistors in wafer 110. The supply modulator may include Si CMOS transistors in wafer 110 or chiplet transistors in gallium nitride of a chiplet.

Circuit 1102 illustrates an alternative to envelope modulation of circuit 1100 that is referred to as envelope elimination. In circuit 1102, the time varying amplitude information 1162 is supplied separately to the phase information of the amplifier 1114 from the RF input 1142 supplied to block 1131. The envelope or amplitude information 1162 is amplified through the CMOS envelope amplifier 1114, and provided to a DC bias supply such as the supply modulator. The output of the supply modulator and block 1131 are input to block 1132 which provides output 1164 based on those inputs.

Circuits 1100 and 1102 use the CMOS envelope signal circuitry of the wafers to improve the efficiency and linearity of the performance of the chiplet compound semiconductor transistors. A typical problem with supply modulators, LDOs, EDs and power amplifier drains is that their long wire bond lengths leads to parasitic inductance and/or capacitance. However, for circuits 1100 and 1102 because the CMOS supply modulator, ED and amplifier 1114 of the wafer are so close to the chiplets, they have shorter interconnects 510 and thus much less parasitic inductance and/or capacitance between those components and the chiplet transistors. In some cases, the length of interconnects 510 is 4× less in length or distance than a typical corresponding circuit not using the wafer and chiplet technology herein, such as also using interconnects 510 directly one the lateral bonding material 360. This 4× less interconnect length or distance may reduce the parasitic inductance and/or capacitance linearly, such as to 4× less parasitic inductance and/or capacitance. It is noted that this reduction in parasitic inductance and/or capacitance may apply to embodiments for all of FIGS. 6-13.

The length of interconnects 510 may be in a range of between 10 and 80 μm or microns. The length may be less than 80 microns. The parasitic inductance may be proportional to the length of the interconnects over the lateral bonding materials or total interconnect length. As a result, the parasitic inductance may correspondingly be in a range of between 10 and 80 pico-Henrys (H). It may be less than 80 pico-Henrys. It is noted that this reduction in parasitic inductance may apply to embodiments for all of FIGS. 6-13.

Also, because the CMOS supply modulators, ED and amplifier 1114 of the wafer are so close to each other, they have shorter interconnects between each other leading to less parasitic inductance and/or capacitance between each other.

Moreover, because they are fabricated of or on the Si wafer, the CMOS supply modulators, ED and amplifier 1114 they are smaller and closer than if they were fabricated on the chiplet or of the chiplet semiconductor material. Since they are smaller and closer, they have less parasitic inductance and/or capacitance between each other.

Figure 12:
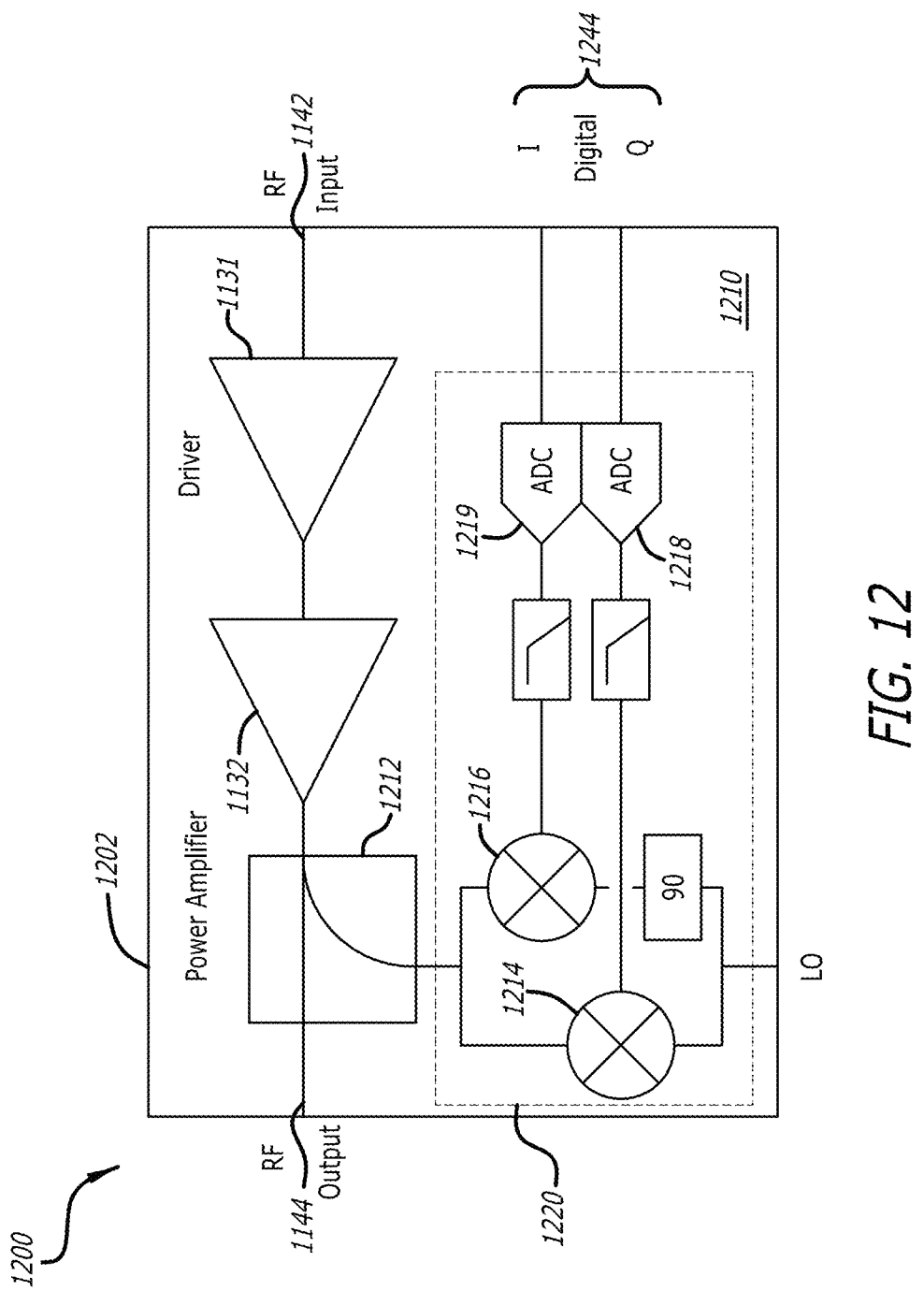
FIG. 12 shows a block diagram of a digital predistortion circuit including a CMOS-based wafer having a CMOS observation receiver; and including chiplet compound semiconductor devices heterogeneous integrated into the wafer.

FIG. 12 shows a block diagram 1200 of digital predistortion circuit 1202 including a CMOS-based wafer 1210 (e.g., a silicon interposer) having a CMOS observation receiver 1220; and including chiplet compound semiconductor devices 1131 and 1132 heterogeneous integrated into the wafer 1210. Circuit 1202 may be part of a radio (e.g., a product) such as part of radio receiver 1002. Wafer 1210 or a radio it is part of may be a chip or integrated circuit diced from a wafer 110. Each block other than device blocks 1131 and 1132 may be CMOS or other wafer 110 based technology.

Circuit 1200 illustrates another use of the heterogeneous integration approach, here to perform digital predistortion. The output of the power amplifier 1132 is tapped by tap 1212 and the tapped signal is used to feedback through a CMOS observation receiver 1220 to produce digital I and Q signals 1244. Receiver 1220 may be an analog to digital I/Q receiver. The I and Q signals 1244 may have phases that are 90 degrees apart and be called "in quadrature". The I signal may be a cosine waveform, and the Q signal may be a sine waveform. The I/Q receiver provides base band information that can be sampled at a Nyquist rate or subsampled, and its output digital I and Q signals 1244 can be provided to a digital signal processor DSP (not shown) that can provide adaptation of the input signal 1142 via feedback from the DSP. The tap 1212 and/or receiver 1220 may include Si CMOS transistors in wafer 110.

Circuit 1200 may be a heterogeneous circuit for a power amplifier 1132 that uses a CMOS observation receiver 1220 that monitors the complex signal produced by the power amplifier 1132 and feeds this signal back as output digital I and Q signals 1244 to a digital signal processor to ensure that the complex signal meets the linearity requirements of a wireless physical layer specification. Here, the output of the compound semiconductor device 1132 is tapped at tap 1212 to monitor the output signal of block 1132. A tap value of −30 dB of the output signal of block 1132 is introduced by the tap 1212 to I/Q mixers 1214 and 1216 of receiver 1220 that each frequency convert the complex signal into I and Q baseband signal components. Mixers 1214 and 1216 have a LO signal input, and mixer 1216 has a 90 degree phase shift of the LO signal. Relatively low sampling rate analog-to-digital (ADC) converters 1218 and 1219 can be used to sub-sample each of the received (I and Q baseband signal component) signal bandwidth and reconstruct the linearity of the signal to output the digital I and Q signals 1244. Converters 1218 and 1219 have a lowpass filter at their signal input.

Having receiver 1220 as Si CMOS transistors in wafer 110 is very beneficial because there may be tens, or hundreds of CMOS transistors in receiver 1220. Having these transistors in wafer 1210 can provide the same benefits noted at FIG. 11 for having the supply modulator, ED and trap 1112 in the wafer 1110.

In some sense, this observation receiver 1220 that feeds output I and Q to base band is a "Holy Grail" because on a single wafer 1202 or diced chip it has the power amplifier 1132 (and optionally driver 1131), coupler or tap 1212, and observation receiver 1220 to feed output to the base band. By having these on the same chip with all the CMOS transistors of receiver 1220 below, and the two chiplets above, it is possible to greatly reduce parasitic inductance and/or capacitance.

Having receiver 1220 as Si CMOS transistors in wafer 110 is very beneficial because the length of interconnects 510 between receiver 1220 and components of blocks 1131 and 1132 may be in a range of between 10 and 80 μm or microns. The length may be less than 80 microns. The parasitic inductance in these interconnects 510 may be proportional to the length of the interconnects over the lateral bonding materials or total interconnect length. As a result, the parasitic inductance for these interconnects 510 may correspondingly be in a range of between 10 and 80 pico-Henrys (H). It may be less than 80 pico-Henrys.

Figure 13:
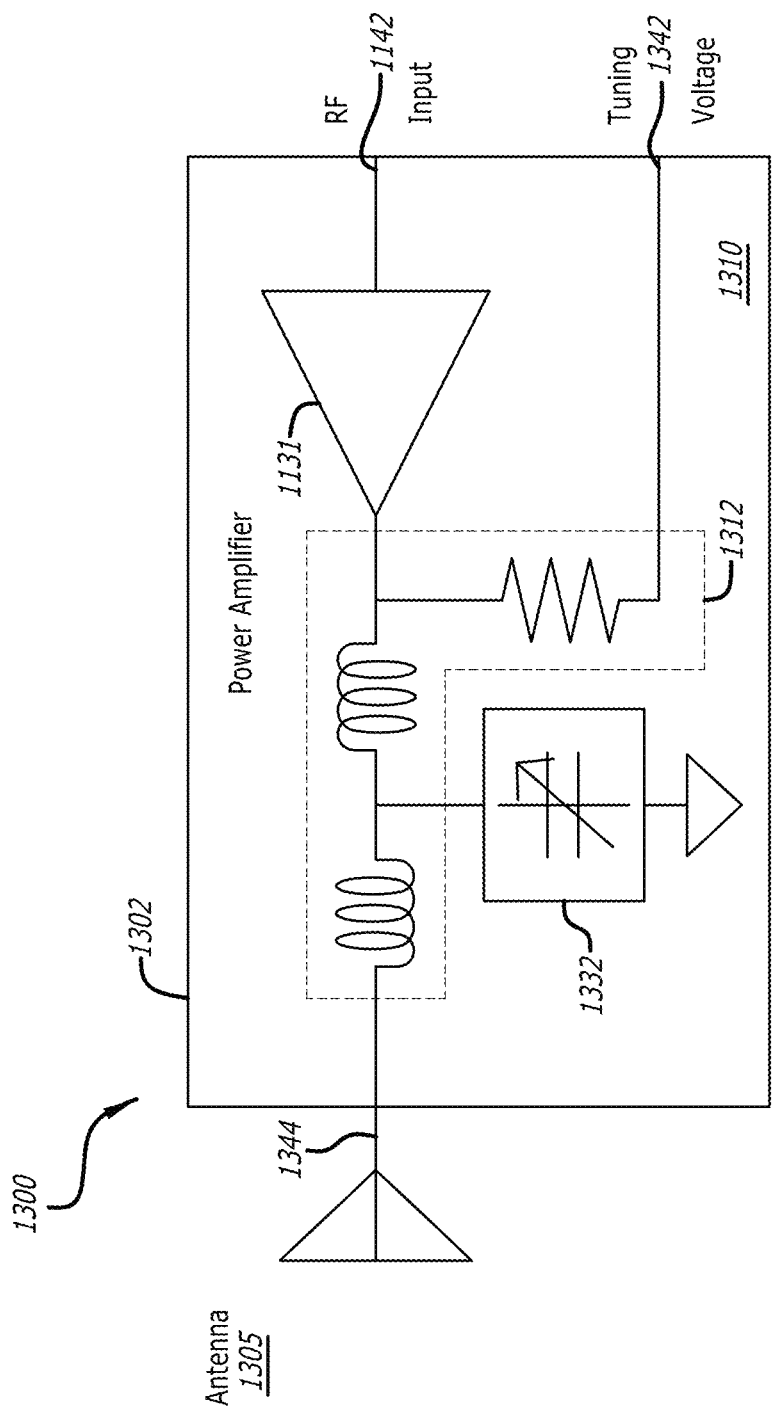
FIG. 13 shows a block diagram of an impedance tuner for an antennae, the tuner including a CMOS-based wafer having a CMOS matching network; and including chiplet compound semiconductor devices heterogeneous integrated into the wafer.

FIG. 13 shows a block diagram 1300 of an impedance tuner 1302 for an antennae 1305, the tuner 1302 including a CMOS-based wafer 1310 (e.g., a silicon interposer) having a CMOS matching network 1312; and including chiplet compound semiconductor devices 1132 and 1332 heterogeneous integrated into the wafer 1310. Circuit 1302 may be part of a radio (e.g., a product) such as part of radio receiver 1002. Wafer 1310 or a radio it is part of may be a chip or integrated circuit diced from a wafer 110. Any of blocks 1132 and 1332 may be any of the circuits of FIGS. 6-9. Each component or block other than device blocks 1132 and 1332 may be CMOS or other wafer 110 based technology.

Each of device blocks 1132 and 1332 may be chiplet 130a and/or 130b. Block 1132 may be a low noise RF amplifier. Block 1132 may be an RF driver or an RF power amplifier. Block 1332 may be a high Q tuning capacitor formed on a compound semi-conductor chiplet that is integrated on the wafer 1310.

Circuit 1300 illustrates another use of the heterogeneous integration approach of using chiplets 1131 and 1332 integrated into a wafer 1310 to perform impedance tuning between the power amplifier (1131) to the antenna 1305. Tuner 1302 has RF input 1142 to block 1131, tuning voltage input 1342 to the resistor, and output 1344 to the antennae 1305. The output of the chiplet power amplifier 1131 is combined with a passive matching network 1312 on the silicon interposer or wafer 1310 and chiplet block 1332. Block 1332 is a high Q tuning capacitor formed as an alternative compound semi-conductor chiplet device integrated on the wafer 1310. The impedance tuner 1302 is illustrated as a capital T network having the inductors and block 1332.

Circuit 1300 may be a heterogeneous RF circuit for power amplifier 1131 that performs tuning of the impedance presented by an antenna 1305 to the power amplifier 1131. A tuning impedance can be produced using CMOS transistors in chiplet block 1332, such as SOI switches, that provide for tunable capacitors. These chiplet tunable capacitors are capable of adjusting the impedance matching between the antenna 1305 and the power amplifier 1131 are illustrated as the T-network formed with series inductors and the shunt variable capacitor 1332. Other network implementations are possible including pi-networks formed with a pair of shunt variable capacitors (e.g., a pair of block 1332) and a series inductor; or alternatively series inductors and shunt capacitors. The use of chiplet stacked-FET SOI transistors can be used to improve the power handling of the tuning element 1332.

Network 1312 may be or be included as part of network 612, network 652 or another matching network on wafer 1310 or 110, such as having passive capacitors, inductors, resistors and connections to ground, connected through heterogeneous interconnects 510 to the devices 1132 and/or 1332.

Having tuner 1302 with block 1332 of better semiconductor chiplet devices and network 1312 on Si wafer 1310 is very beneficial because when you combine in the block 1332 chiplets and the CMOS on the wafer, it provides higher quality factor (high-Q), and lower loss. Other designs that do not use chiplet based block 1332 typically have to use stacked FET's and switches.

In FIGS. 6-13, the wafer CMOS transistors, diced chip CMOS transistors, tuning circuits, matching network circuitry, DC bias CMOS, feedback OP amps, power detectors, temperature sensors of the wafers may be on the same vertical layer as the chiplet RF transistors. This same vertical level provides shorter connections between the CMOS and RF transistors such as using interconnects 510 which may be horizontal and/or require less vertical interconnect or connection pad distance, thus reducing noise, increasing DC bias accuracy, and greatly reducing parasitic inductance and/or capacitance.

FIGS. 6-13 may show in-substrate circuitry for optimizing the operating conditions of heterogeneous devices. The benefits of this approach compared to other designs include: use of lateral mechano-chemical chiplet bonding material 360 form a low cost and scalable volume and uses CMOS circuitry of the wafer to control the chiplet operating conditions; direct use of CMOS circuitry of the wafer to control a HEMT and/or HBT integrated into the interposer/wafer used for chiplet integration, without degrading the performance of the chiplets or diced chips.

First, FIGS. 6-13 may show CMOS transistors realized in the collocated silicon substrate (e.g., the wafer or diced chip having the wafer 110 and chiplet(s)) to actuate the DC biasing of a compound semiconductor transistor of chiplets to optimize millimeter-wave operation. The CMOS transistors provide gate (or base) biasing of a HEMT or HBT to optimize the ability of the integrated chiplet transistor to maintain maximum gain, output power, noise and/or efficiency. Additionally, the described embodiments provide drain (or collector) biasing of the HEMT (or HBT) to moderate the voltage supply. The CMOS transistors realized in the collocated silicon substrater can be used for power management of the in-wafer integrated chiplet III-V devices through analog or digital feedback that can adjust the voltage or current applied to the transistor.

Second, FIGS. 7-13 may show that CMOS transistors realized in the collocated silicon substrate sense the operating conditions of a HEMT (or HBT). The CMOS transistors are designed to generate a voltage or current in response to the RF power incident on the gate (or base) of the HEMT (or HBT) and generated on the drain (or collector) of the transistor. Additionally, the CMOS transistors monitor the operating temperature of the compound semiconductor transistor through circuits that produce a voltage or current that is constant and/or proportional to temperature.

Third, FIGS. 10-13 may show the CMOS transistors realized in the collocated silicon substrate can be realized to produce analog and RF blocks in a transmitter or receiver chain that includes frequency multipliers, frequency mixers, phase shifters, signal attenuators as well as radio-frequency, intermediate-frequency, or baseband amplifiers. Benefits of this collocation include close proximity between the CMOS and HEMT or HBT chiplet transistors to avoid loss in the parasitic elements.

Fourth, FIGS. 10-13 and/or FIGS. 8-9B may show an application of the unique combination of the CMOS and HEMT/HBT for an RF application in a monolithic wafer would be for extreme conditions such as high or low temperatures as might be found in Satellite electronics or cryogenic environments. Here, due to the heterogeneous integration of the chiplet and wafer, temperature sensors on the wafer, or partly on the wafer and chiplet may survive and operate properly in these extreme conditions.

Embodiments of FIGS. 10-13 disclose methods, devices and systems that integrate wafer based CMOS and chiplet based HEMT or HBT transistors, and utilize the wafer based CMOS transistors to offer much lower power and cost to achieve digital and analog behavior to sense, actuate, and improve the RF circuitry, such as of the chiplets.

In some cases, the embodiments herein include an electronics assembly having one or more RF transistor chiplets each having a chiplet circuit including a high-electron-mobility transistor (HEMT) or a heterojunction bipolar transistor (HBT); and a host wafer having at least one host wafer circuit for the purpose of (e.g., configured for) producing bias conditions that optimize performance of the HEMT or HBT, the at least one host wafer circuit including one of: first circuitry to provide (e.g., providing) a DC bias of the HEMT or HBT; or a second circuitry configured to sense radio-frequency operating conditions, such as the DC bias and/or an operating temperature of the HEMT or HBT; and electrical interconnects between the chiplet and the wafer, wherein the electrical interconnects electrically connect the host wafer circuit to the chiplet circuit. The host wafer circuit can have first circuitry to provide a DC bias of the HEMT or HBT; and second circuitry configured to sense operating conditions of the HEMT or HBT.

One or more chiplets can have one or more HEMTs or one or more HBTs. One or more chiplet can have one or more HEMTs and one or more HBTs. One chiplet can be formed from (e.g., with, using, of, on) a first semiconductor material, and another chiplet can be formed from a second semiconductor material, and the wafer is formed from a third semiconductor material. The first and second semiconductor material can be different material than the third semiconductor material; or the first, second and third semiconductor materials can be all different from each other.

The first circuitry can be configured to provide a DC bias of the HEMT or HBT such as by actuating DC biasing of the HEMT or HBT to optimize millimeter-wave operation of the HEMT or HBT. The first circuitry can have at least one a CMOS transistor configured to (e.g., be an NMOS transistor having a drain electrically connected to a gate or base of the HEMT or HBT, and a source electrically connected to a gate or base voltage supply for the HEMT or HBT to) provide biasing of the gate or base of the HEMT or HBT to optimize the ability of the HEMT or HBT to maintain maximum gain, output power, noise and/or efficiency; and/or (e.g., be a PMOS transistor having a source electrically connect to a drain or collector of the HEMT or HBT, and a drain electrically connected to a drain or collector voltage supply for the HEMT or HBT to) provide biasing of a drain or collector of the HEMT or HBT to moderate a voltage supply such as on the wafer.

The second circuitry can be configured to sense operating conditions such as DC biases of the HEMT or HBT, and include at least one CMOS transistor configured to (e.g., be an NMOS transistor having a drain electrically connect to a gate or base of the HEMT or HBT, and a source electrically connected to a gate or base voltage supply for the HEMT or HBT; and a feedback element including an operational amplifier having one input electrically connect to a gate or base reference voltage and/or current signal, a second input electrically connect to the gate or base of the HEMT or HBT and an output electrically connect to a gate of the NMOS transistor to) generate a voltage or current signal) to (e.g., of, on, at, coupled to, towards; the signal may go through other circuitry like through an inductor) the gate or base of the HEMT or HBT in response to the RF power incident on the gate or base of the HEMT or HBT; and/or (e.g., be a PMOS transistor having a source electrically connect to a drain or collector of the HEMT or HBT, and a drain electrically connected to a drain or collector voltage supply for the HEMT or HBT; and a feedback element including an operational amplifier having one input electrically connect to a drain or collector reference voltage and/or current signal, a second input electrically connect to the drain or collector of the HEMT or HBT and an output electrically connect to a gate of the PMOS transistor to) generate a voltage or current to the drain or collector of the HEMT or HBT in response to the RF power incident on the drain or collector of the HEMT or HBT.

In some cases, the second circuitry includes at least one a temperature sensor configured to monitor or sense the operating temperature of the HEMT or HBT, and to produce a reference voltage or current that is constant and/or proportional to the monitored/sensed temperature. The temperature sensor may have a first P/N diode and a second P/N diode on the chiplet and electrically coupled to (e.g., the source or emitter of) the the HEMT or HBT, the second diode having an electrical characteristic/resistance that is unequal to that of the first diode. The temperature sensor may have an operational amplifier, a first feedback resistor between an output of the operational amplifier and (a first input of the operational amplifier and the first diode), and a second feedback resistor between the output of the operational amplifier and a second input of the operational amplifier and the second diode.

In some cases, the one host wafer circuit has third circuitry configured to produce (e.g., using or in the HEMT or HBT) analog and/or RF blocks in one of a transmitter or receiver chain that includes one of frequency multipliers, frequency mixers, phase shifters, signal attenuators, RF intermediate-frequency or baseband amplifiers.

Being for the "purpose of", "for", "to", or "performing" an action may include being able to or configured to perform that action. Being connected to another device may include being coupled, being electrically connected and/or being electrically coupled to the other device.

CLOSING COMMENTS

Throughout this description, the embodiments and examples shown should be considered as exemplars, rather than limitations on the apparatus and procedures disclosed or claimed. Although many of the examples presented herein involve specific combinations of method acts or system elements, it should be understood that those acts and those elements may be combined in other ways to accomplish the same objectives. With regard to flowcharts, additional and fewer steps may be taken, and the steps as shown may be combined or further refined to achieve the methods described herein. Acts, elements and features discussed only in connection with one embodiment are not intended to be excluded from a similar role in other embodiments.

As used herein, "plurality" means two or more. As used herein, a "set" of items may include one or more of such items. As used herein, whether in the written description or the claims, the terms "comprising", "including", "carrying", "having", "containing", "involving", and the like are to be understood to be open-ended, i.e., to mean including but not limited to. Only the transitional phrases "consisting of" and "consisting essentially of", respectively, are closed or semi-closed transitional phrases with respect to claims. Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements. As used herein, "and/or" means that the listed items are alternatives, but the alternatives also include any combination of the listed items.

It is claimed:

1. An electronic assembly for heterogeneous integration of radio frequency (RF) transistor chiplets having interconnections to host wafer circuits, the assembly comprising:
    at least one RF transistor chiplet each having a chiplet circuit including a high-electron-mobility transistor (HEMT) or a heterojunction bipolar transistor (HBT);
    a host wafer having at least one host wafer circuit for the purpose of producing bias conditions that optimize performance of the HEMT or HBT, the at least one host wafer circuit including one of:
        first circuitry to provide a DC bias of the HEMT or HBT; or
        second circuitry configured to sense radio-frequency operating conditions of the HEMT or HBT; and
    electrical interconnects between the chiplet and the host wafer, wherein the electrical interconnects electrically connect the host wafer circuit to the chiplet circuit.

2. The electronic assembly of claim 1, wherein the at least one chiplet includes at least two chiplets including a first chiplet having a first chiplet circuit having the high-electron-mobility transistor (HEMT) and a second chiplet having a second chiplet circuit having the heterojunction bipolar transistor (HBT).

3. The electronic assembly of claim 1, wherein the at least one chiplet includes at least two chiplets including a first chiplet having the high-electron-mobility transistor (HEMT) and a second chiplet having another high-electron-mobility transistor (HEMT).

4. The electronic assembly of claim 1, wherein the at least one chiplet includes at least two chiplets including a first chiplet having the heterojunction bipolar transistor (HBT) and a second chiplet having another heterojunction bipolar transistor (HBT).

5. The electronic assembly of claim 1, wherein the at least one chiplet includes at least two chiplets each including one of: a chiplet circuit including at least one high-electron-mobility transistor (HEMT) and at least one heterojunction bipolar transistor (HBT), a chiplet circuit including at least two high-electron-mobility transistors (HEMTs), or a chiplet circuit including at least two heterojunction bipolar transistors (HBTs).

6. The electronic assembly of claim 1, wherein the at least one chiplet includes at least two chiplets including a first chiplet formed from a first semiconductor material and a second chiplet is formed from a second semiconductor material, and the host wafer is formed from a third semiconductor material; and
wherein one of: the first and second semiconductor material are a different material than the third semiconductor material; or the first, second and third semiconductor materials are all different from each other.

7. The electronic assembly of claim 1, wherein the first circuitry is configured to actuate DC biasing of the HEMT or HBT to optimize RF characteristics of the HEMT or HBT, and includes at least one CMOS transistor configured to at least one of:
provide biasing of a gate or base of the HEMT or HBT to optimize the ability of the HEMT or HBT to maintain maximum gain, output power, noise or efficiency; or
provide biasing of a drain or collector of the HEMT or HBT to moderate a voltage supply.

8. The electronic assembly of claim 7, wherein providing biasing of the gate or base includes an NMOS transistor having a source electrically connected to the gate or base of the HEMT or HBT, and a drain electrically connected to a gate or base voltage supply for the HEMT or HBT to provide biasing of the gate or base of the HEMT or HBT; and
wherein providing biasing of the drain or collector includes a PMOS transistor having a source electrically connected to a drain or collector of the HEMT or HBT, and a drain electrically connected to a drain or collector voltage supply for the HEMT or HBT to provide biasing of a drain or collector of the HEMT or HBT to moderate a voltage supply on the host wafer.

9. The electronic assembly of claim 1, wherein the second circuitry is configured to sense DC biases of the HEMT or HBT, and includes at least one a CMOS transistor configured to at least one of:
generate a voltage or current to a gate or base of the HEMT or HBT in response to RF power incident on the gate or base of the HEMT or HBT, or
generate a voltage or current to the drain or collector of the HEMT or HBT in response to the RF power incident on the drain or collector of the HEMT or HBT.

10. The electronic assembly of claim 9, wherein generating a voltage or current to the gate or base includes an NMOS transistor having a source electrically connected to the gate or base of the HEMT or HBT, and a drain electrically connected to the gate or base voltage supply for the HEMT or HBT; and a feedback element including an operational amplifier having one input electrically connected to a gate or base reference voltage or current signal, a second input electrically connected to the gate or base of the HEMT or HBT and an output electrically connected to a gate of the NMOS transistor; and
wherein generating a voltage or current to the drain or collector includes a PMOS transistor having a source electrically connected to a drain or collector of the HEMT or HBT, and a drain electrically connected to a drain or collector voltage supply for the HEMT or HBT; and a feedback element including an operational amplifier having one input electrically connected to a drain or collector reference voltage or current signal, a second input electrically connected to the drain or collector of the HEMT or HBT and an output electrically connected to a gate of the PMOS transistor.

11. The electronic assembly of claim 1, wherein the second circuitry includes a temperature sensor configured to sense the operating temperature of the HEMT or HBT, and to produce a reference voltage or current that is constant and proportional to the monitored temperature, wherein the temperature sensor includes:
a first P/N diode and a second P/N diode on the at least one chiplet and electrically coupled to the HEMT or HBT, the second diode having an electrical characteristic that is unequal to that of the first diode,
an operational amplifier,
a first feedback resistor between an output of the operational amplifier and a first input of the operational amplifier and the first diode, and
a second feedback resistor between the output of the operational amplifier and a second input of the operational amplifier and the second diode.

12. The electronic assembly of claim 1, further comprising:
third circuitry configured to produce one of: analog or RF blocks in one of a transmitter or receiver chain that includes one of frequency multipliers, frequency mixers, phase shifters, signal attenuators, RF intermediate-frequency or baseband amplifiers.

13. The electronic assembly of claim 1, further comprising:
a backside capping layer having a top surface and a back surface;
a back surface of the host wafer bonded to the top surface of the backside capping layer except for first and second cavities in the host wafer formed over first and second areas of the top surface of the backside capping layer, the first and a second cavities having first and a second side surfaces;
wherein the at least one chiplet includes at least two first chiplets each including a first chiplet circuit having the high-electron-mobility transistor (HEMT) and at least two second chiplets each including a second chiplet circuit having one of the heterojunction bipolar transistor (HBT);
wherein the HBT includes:
a first chiplet thickness, a first backside and a first frontside, the first backside of the first chiplet bonded directly to at least a first portion of a first area of the top surface of the backside capping layer, wherein the first portion has a first capping layer thickness of the backside capping layer;
wherein the HEMT includes:
a second chiplet thickness, a second backside and a second frontside, the second backside of the at least two second chiplets bonded directly to at least a second portion of a second area of the top surface of the backside capping layer, wherein the second portion has a second capping layer thickness of the backside capping layer; and a lateral bonding material between side surfaces of the first and second chiplets and the first and a second side surfaces of the first and second cavities;

wherein the first chiplet thickness is greater than the second chiplet thickness;

wherein the first capping layer thickness of the backside capping layer is less than the second capping layer thickness of the backside capping layer; and wherein the second capping layer thickness of the backside capping layer includes metal backfill plugs between the second backsides of the second at least two second chiplets and the first capping layer thickness of the backside capping layer.

14. The electronic assembly of claim 1, wherein the host wafer is vertically diced along a perimeter of the host wafer around at least one chiplet to form chips each having the at least one chiplet, the interconnects and an area of the host wafer surrounding the at least one chiplet and having the at least one wafer circuit.

15. An electronic assembly for heterogeneous integration of radio frequencies (RF) transistor chiplets having interconnections to host wafer circuits, the assembly comprising:
at least one RF transistor chiplet each having a chiplet circuit including a high-electron-mobility transistor (HEMT) or a heterojunction bipolar transistor (HBT);
a host wafer having at least one host wafer circuit for the purpose of optimizing operating conditions of the HEMT or HBT, the at least one host wafer circuit including one of:
first circuitry to provide a DC bias of the HEMT or HBT; or
second circuitry configured to sense radio-frequency operating conditions of the HEMT or HBT;
a lateral bonding material between side surfaces of the at least one RF transistor chiplet and side surfaces of cavities in the host wafer; and
electrical interconnects between the at least one chiplet and the host wafer, wherein the electrical interconnects electrically connect the host wafer circuit to the chiplet circuit.

16. The electronic assembly of claim 15, wherein the at least one chiplet includes at least two chiplets including a first chiplet having a first chiplet circuit having the high-electron-mobility transistor (HEMT) and a second chiplet having a second chiplet circuit having the heterojunction bipolar transistor (HBT).

17. The electronic assembly of claim 15, wherein the at least one chiplet includes at least two chiplets each including one of: a chiplet circuit including at least one high-electron-mobility transistor (HEMT) and at least one heterojunction bipolar transistor (HBT), a chiplet circuit including at least two high-electron-mobility transistors (HEMTs), or a chiplet circuit including at least two heterojunction bipolar transistors (HBTs).

18. The electronic assembly of claim 15, wherein the at least one chiplet includes a first chiplet and a second chiplet, wherein the first chiplet is formed from a first semiconductor material, the second chiplet is formed from a second semiconductor material, and the host wafer is formed from a third semiconductor material; and
wherein one of: the first and second semiconductor material are a different material than the third semiconductor material; or the first, second and third semiconductor materials are all different from each other.

19. The electronic assembly of claim 15, wherein the second circuitry is for performing in extreme conditions including temperatures found in satellite electronics or cryogenic environments.

20. The electronic assembly of claim 15, wherein the interconnects have a length in a range of between 10 and 80 microns, and a parasitic inductance of the interconnects is in a range of between 10 and 80 pico-Henrys (H).

21. The electronic assembly of claim 15, wherein the HEMT is a high-electron-mobility field effect transistor utilizing a heterojunction of materials with different band gaps to enhance performance in high-frequency applications; and the HBT is a type of bipolar junction transistor (BJT) which uses differing semiconductor materials for emitter and base regions, creating a heterojunction to improve on the BJT by handling signals of very high frequencies, up to several hundred GHz.

22. The electronic assembly of claim 15, wherein the host wafer includes at least one layer of silicon (Si); and wherein each chiplet includes at least two HEMTs or HBTs and the interconnects from the transistors to contact pads on a frontside surface of the chiplet; and wherein each chiplet is a pre-fabricated transistor chiplet.

23. An electronic assembly comprising:
a plurality of RF transistor chiplets each having a chiplet circuit including a high-electron-mobility transistor (HEMT) or a heterojunction bipolar transistor (HBT);
a host wafer having at least one host wafer circuit for the purpose of tuning the operating bias conditions of the HEMT or HBT, the at least one host wafer circuit including:
first circuitry to provide a DC bias of the HEMT or HBT; and
second circuitry configured to sense radio-frequency operating conditions of the HEMT or HBT;
a lateral bonding material between side surfaces of the plurality of RF transistor chiplets and side surfaces of cavities in the host wafer; and
electrical interconnects between the chiplet and the host wafer, wherein the electrical interconnects electrically connect the host wafer circuit to the chiplet circuit.

24. The electronic assembly of claim 23, wherein a first chiplet of the plurality of chiplets is formed from a first semiconductor material, a second chiplet of the plurality of chiplets is formed from a second semiconductor material, and the host wafer is formed from a third semiconductor material; and
wherein one of: the first and second semiconductor material are a different material than the third semiconductor material; or the first, second and third semiconductor materials are all different from each other.

* * * * *